(12) United States Patent
Nordman et al.

(10) Patent No.: US 9,322,889 B2
(45) Date of Patent: Apr. 26, 2016

(54) LOW HYSTERESIS HIGH SENSITIVITY MAGNETIC FIELD SENSOR

(75) Inventors: Catherine Ann Nordman, Saint Paul, MN (US); Peter Eames, Minneapolis, MN (US); Russ Beech, Ramsey, MN (US); David J. Brownell, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 1081 days.

(21) Appl. No.: 13/341,355

(22) Filed: Dec. 30, 2011

(65) Prior Publication Data
US 2013/0169271 A1    Jul. 4, 2013

(51) Int. Cl.
G01R 33/14    (2006.01)
G01R 33/09    (2006.01)

(52) U.S. Cl.
CPC .................... G01R 33/098 (2013.01)

(58) Field of Classification Search
USPC ................. 324/222, 101, 200, 443
See application file for complete search history.

(56) References Cited

U.S. PATENT DOCUMENTS

| | | | | |
|---|---|---|---|---|
| 3,731,005 A | * | 5/1973 | Shearman | 360/123.01 |
| 3,992,691 A | * | 11/1976 | Molthen | 336/200 |
| 4,543,553 A | * | 9/1985 | Mandai | H01F 17/0013 29/602.1 |
| 6,031,273 A | * | 2/2000 | Torok et al. | 257/421 |
| 7,054,114 B2 | * | 5/2006 | Jander et al. | 360/324.1 |
| 7,327,211 B2 | * | 2/2008 | Ruan et al. | 335/78 |
| 7,839,605 B2 | * | 11/2010 | Parker | G01R 33/04 360/318 |
| 7,859,255 B2 | * | 12/2010 | Doogue et al. | 324/207.25 |
| 8,427,270 B2 | * | 4/2013 | Maeda | H01F 17/0013 336/147 |
| 8,890,266 B2 | * | 11/2014 | Mather et al. | 257/421 |
| 2002/0186011 A1 | * | 12/2002 | Murata et al. | 324/252 |
| 2003/0137374 A1 | | 7/2003 | Ruan et al. | |
| 2004/0137275 A1 | | 7/2004 | Jander | |
| 2008/0225576 A1 | * | 9/2008 | Zhong et al. | 365/158 |
| 2009/0102464 A1 | | 4/2009 | Doogue | |
| 2012/0112868 A1 | * | 5/2012 | Wu et al. | 336/200 |

OTHER PUBLICATIONS

European Search Report dated Nov. 6, 2015, for corresponding European Patent Application No. 12198640.0.

* cited by examiner

*Primary Examiner* — Son Le
*Assistant Examiner* — Giovanni Astacio-Oquendo
(74) *Attorney, Agent, or Firm* — Kinney & Lange, P.A.

(57) ABSTRACT

An MTJ sensor having low hysteresis and high sensitivity is disclosed. The MTJ sensor includes, in one embodiment, a bridge with first and second active MTJ elements and first and second passive MTJ elements connected in a Wheatstone bridge configuration. First and second magnetic shield elements are located over the first and second passive MTJ elements and form a gap therebetween that concentrates magnetic flux toward the first and second active MTJ elements. A three-dimensional coil is wound around the first and second magnetic shield elements with over-windings located over the first and second magnetic shield elements and under-windings located under the first and second magnetic shield elements, connected together by a plurality of vias adjacent the first and second magnetic shield elements.

15 Claims, 19 Drawing Sheets
:::

Cross-Sectional View

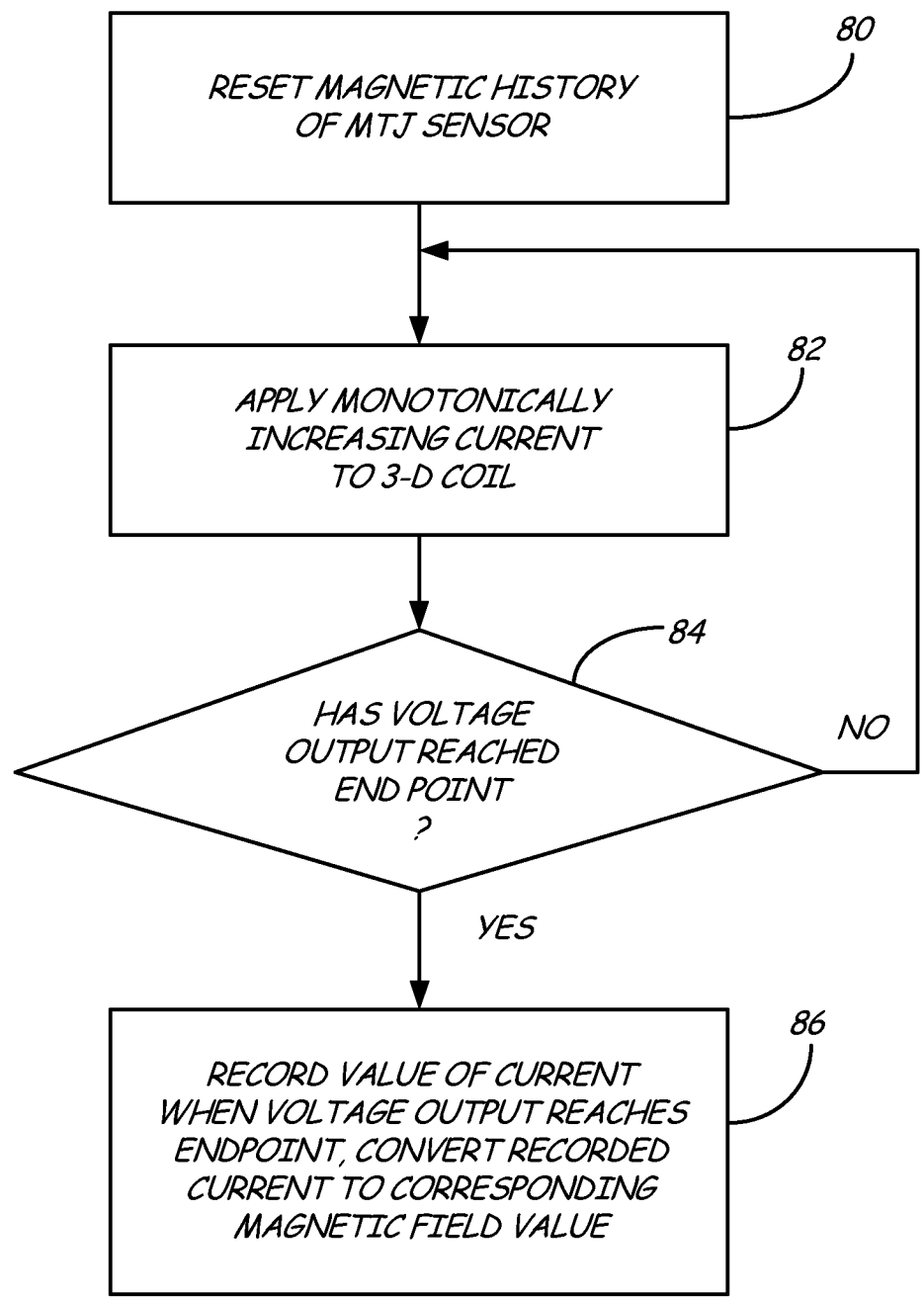

LOW HYSTERESIS HIGH SENSITIVITY MAGNETIC FIELD SENSOR

BACKGROUND

The present invention relates to a magnetic field sensor, and more particularly to magnetic tunnel junction (MTJ) sensor that provides increased sensitivity with reduced hysteresis at a very small size.

MTJ devices are well known to show resistance changes as a function of applied magnetic fields. FIGS. 1A-1C are graphs showing typical output responses of MTJ devices with differing amounts of hysteresis (characterized by open loops in the resistance-versus-magnetic-field curves). FIG. 1A shows the output of a device with significant hysteresis which gives two different resistance values at the same magnetic field, depending on the past history of applied fields. The heavy dashed curve represents resistance values measured when the device is first saturated by applying a sufficiently large field in the negative direction—one that drives the device into the output region characterized by the upper closed, flat, line. Increasing the field monotonically now produces the resistance values of the dashed curve. Similarly the thin solid line represents resistances measured when the part is saturated in the positive direction and then the field is allowed to monotonically decrease. FIG. 1B shows the output of a device with less hysteresis than the output characteristic shown in FIG. 1A, but which has a less steep slope in the middle region of the curve, which results in less resolution of the sensor. FIG. 1C shows the output of a device that has no hysteresis at all, but which has an even less steep slope in the middle region of the curve.

A sensor with a response as shown in FIG. 1A is not well suited for a linear-sensor application whereas a sensor with a response as shown in FIG. 1C is much more ideal in this sense, as it gives a unique resistance value at each value of applied external field. However, the sensor response shown in FIG. 1C has low resolution—a sensor with high resolution would have a correspondingly high slope, or resistance change per change in applied magnetic field. The sensor response shown in FIG. 1B has a higher slope than that of FIG. 1C, but because it has some hysteresis, it can still be double valued over its sensitive region. These are the design trade-offs that have been involved in the design of MTJ sensors.

Hysteresis in a magnetic-field sensor further hinders good performance in that the sensitivity or resistance-versus-applied-field values (slope of the output curve) is also highly dependent on magnetic history. FIG. 2 is a graph of resistance versus applied field in a sensor having a hysteretic output response. As seen in FIG. 2, if the sensor is not driven to saturation then there are an infinite number of other secondary curves over which the resistance can trace. Each of these "minor loops" (loops traced when the magnetic thin film structure is not fully saturated, such as loop 20 in FIG. 2) fall within the envelope of the fully saturated or "major loop" characteristic. Therefore hysteretic devices will show minor-loop sensitivities that are reduced or, at best, no greater than the major loop sensitivity.

MTJ devices are typically comprised of a thin film stack of three functional layer groups—(1) a ferromagnetic "free layer" characterized by its ability to rotate freely in the plane of the thin film with the application of external fields to be measured by the sensor, (2) an insulating thin film that acts as a magnetic tunnel barrier, and (3) a ferromagnetic "pinned layer" whose magnetization vector is constrained by one of various techniques such that it does not rotate with the application of external fields to be measured by the sensor. The MTJ thin-film stack is photolithographically patterned into a suitable shape to create the sensor device. FIG. 3A is a top-down view, and FIG. 3B is a section view, of a typical sensor configuration, showing the magnetization directions of the layers. Contacts (not shown) are fabricated by any of various microelectronic techniques to make electrical connections to free layer 30 and pinned layer 32 of the stack. Current flows perpendicular to the plane of the thin films, across tunnel-barrier thin-film layer 34.

The configuration shown in FIGS. 3A and 3B has an output response as shown in FIG. 1A described above. With pinned layer 32 having a magnetization vector fixed in the same direction as the easy axis of free layer 30, and with no application of any effective orthogonal field (a field in the plane of the thin film but at 90 degrees from the easy axis of free layer 30), free layer 30 experiences switching along its easy axis.

FIG. 4 is a top-down view of an alternative sensor configuration, showing the magnetization directions of the layers, with an effective orthogonal field applied. The magnetization and field direction shown in FIG. 4 are identical to those shown in FIG. 3A, but an effective orthogonal field is applied in a direction as shown by arrow 40. As the effective orthogonal field is increased, hysteresis in the output response is suppressed (and correspondingly, the slope of the resistance output curve is decreased), as shown in FIGS. 1B and 1C described above.

In order to achieve a high resolution sensor, it is desirable to suppress magnetic hysteresis while achieving a relatively steeply sloped resistance output response.

SUMMARY

The present invention is directed to a MTJ sensor having low hysteresis and high sensitivity. In an exemplary embodiment, the MTJ includes a bridge with first and second active MTJ elements and first and second passive MTJ elements connected in a Wheatstone bridge configuration. First and second magnetic shield elements are located over the first and second passive MTJ elements and form a gap therebetween that concentrates magnetic flux toward the first and second active MTJ elements. A three-dimensional coil is wound around the first and second magnetic shield elements with over-windings located over the first and second magnetic shield elements and under-windings located under the first and second magnetic shield elements, connected together by a plurality of vias adjacent the first and second magnetic shield elements.

According to another aspect of the invention, an MTJ sensor may be operated according to a particular mode of operation, which includes resetting a magnetic history of the sensor, monotonically changing an output signal of the sensor toward a chosen endpoint by applying monotonically increasing current to a coil of the sensor, monitoring whether the output signal of the sensor has reached the chosen endpoint, and recording a value of the current applied to the coil at a time when the output signal of the sensor reaches the chosen endpoint, and converting the recorded current value to a corresponding external magnetic field value.

BRIEF DESCRIPTION OF THE DRAWINGS

FIG. 10 is a flow diagram illustrating a method of operating an MTJ sensor to achieve the balancing shown in FIG. 9, according to an embodiment of the present invention.

DETAILED DESCRIPTION

The MTJ single-axis magnetic field sensor described in various exemplary embodiments herein offers a method of controlling the magnetic history of the device, and also employs a combination of various processing techniques to achieve miniature size and reduced power consumption.

Figure 1A:
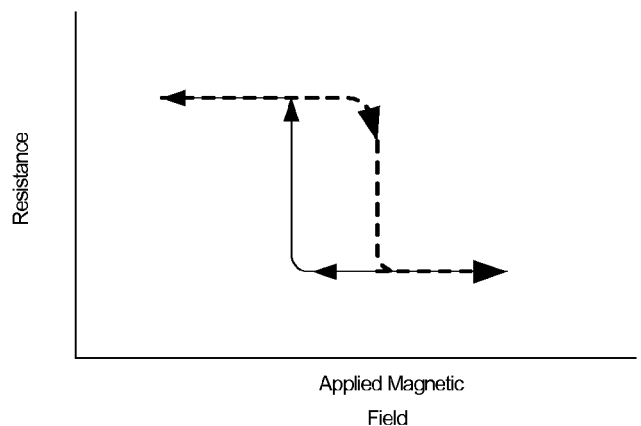
FIGS. 1A-1C are graphs showing typical output responses of MTJ devices with differing amounts of hysteresis.
Figure 5A:
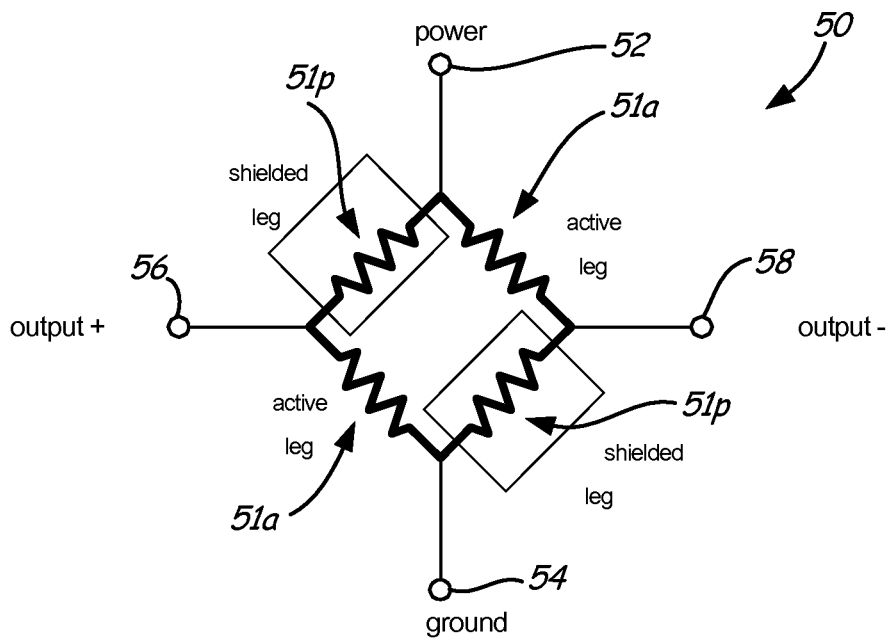
FIG. 5A is a simplified illustration of an MTJ device according to an embodiment of the present invention comprised of a Wheatstone bridge arrangement of tunnel junction elements.

FIG. 5A is a simplified illustration of MTJ device 50 comprised of a Wheatstone bridge arrangement of tunnel junction elements. One or more elements are connected in series to form each resistive "leg" of the bridge. As shown in FIG. 5A, two of the four legs (legs 51p) opposite each other in the bridge circuit diagram) are magnetically shielded from the external fields to be measured, and are the passive legs of the bridge. The resistances of the active (unshielded) legs 51a of the bridge change with external fields. Therefore, by applying a voltage bias to power node 52 and ground node 54, differential voltage changes will be seen across bridge output nodes 56 and 58 in response to external fields, providing a response characteristic with a shape similar to those shown in FIGS. 1A-1C.

Figure 5B:
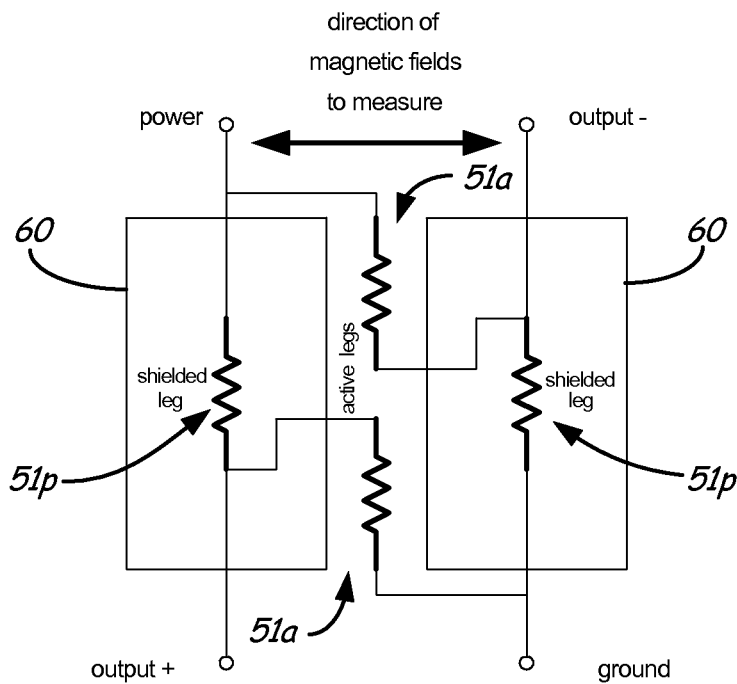
FIG. 5B is a simplified illustration of an exemplary spatial arrangement of an MTJ device according to an embodiment of the present invention.

FIG. 5B is a simplified illustration of a possible spatial arrangement of MTJ device 50. In this arrangement, MTJ device 50 has a field response that is enhanced by the use of shields 60 as flux guides or flux concentrators for the active legs of the bridge. Throughout this description, the terms "shields" and "flux concentrators" are used interchangeably because of the shielding and flux concentrating functions of the elements 60. The pair of thin film elements of high permeability magnetic material making up shields 60 acts to concentrate the flux in the gap between the pair, where the extent of shields 60 in the direction of the field to be measured is greater than the gap between them. Increasing the flux concentration ratio (the field magnitude measured in the gap to the field magnitude applied externally to the sensor chip) directly increases the sensitivity of the sensor.

Other structures sometimes added to magnetic field sensors are electrically conducting stripes on the chip, from which magnetic fields can be generated. A magnetic field is produced by passing current through a conductor, and is useful for producing a compensating field that locally nulls out the external field. The current necessary to null the field becomes a measure of the magnitude of the original external magnetic field. This technique enables the creation of linear sensors with dynamic operating ranges (range of fields that it can measure) that are larger than the saturation fields of the intrinsic magnetic response. By incorporating a feedback scheme dependent on the sensitivity of the MTJ element to magnetic fields, small current changes in the nulling circuit are accurate reflections of the changes in the external magnetic field.

Figure 6A:
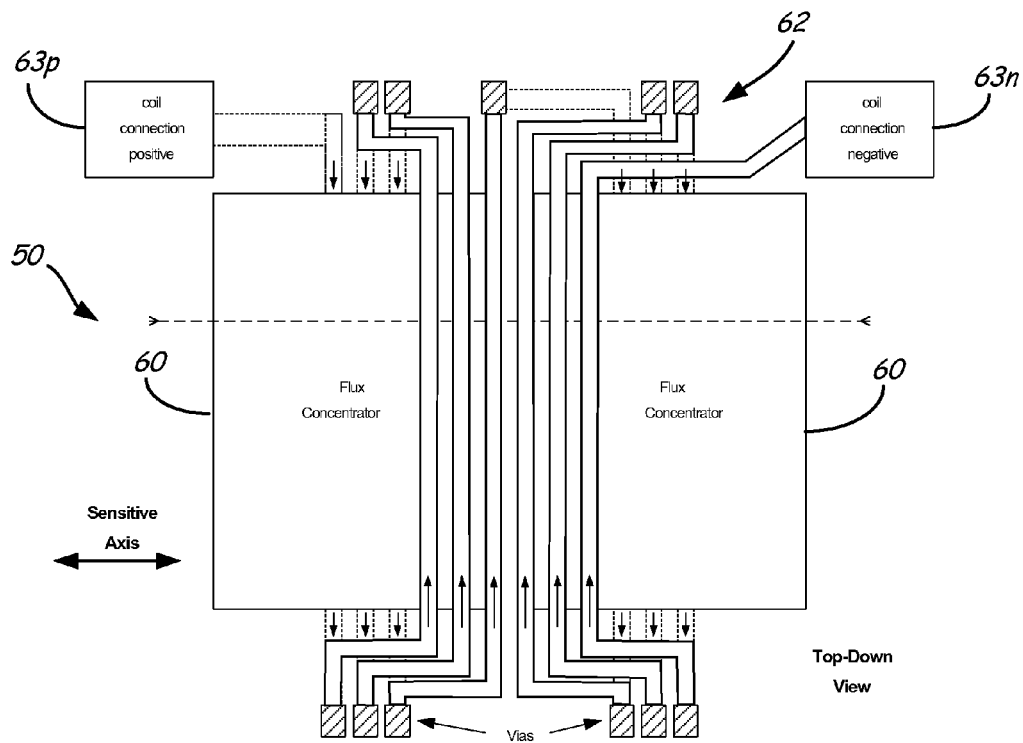
FIG. 6A is a top view of a three-dimensional (3-D) coil according to an embodiment of the present invention, configured to produce a magnetic field for active elements of an MTJ device in the gap between flux concentrators of the device, while at the same time providing a field of different magnitude and opposite direction for passive elements of the MTJ device underneath the flux concentrators of the device.
Figure 6B:
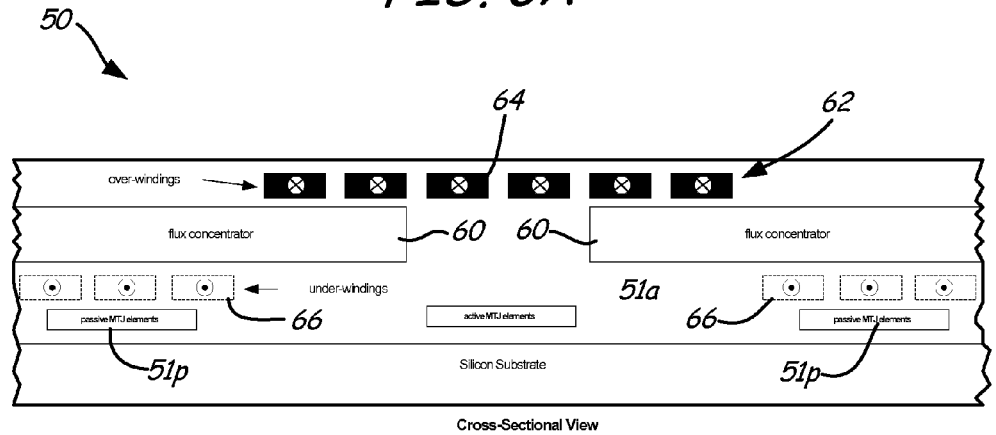
FIG. 6B is a section view of the 3-D coil of FIG. 6A.

This technique of producing on-chip fields is incorporated in a modified fashion into MTJ device 50 as illustrated in the diagrams of FIGS. 6A and 6B. FIG. 6A is a top view, and FIG. 6B is a section view, of three-dimensional (3-D) coil 62 configured to produce a magnetic field for active elements 51a of MTJ device 50 in the gap between flux concentrators 60, while at the same time providing a field of different magnitude and opposite direction for passive elements 51p of MTJ device 50 underneath flux concentrators 60. Instead of using single conducting stripes or a flat in-plane coil, the configuration of 3-D coil 62 in MTJ device 50 encircles both halves of the flux concentrator structure, with coil windings running in the plane and out of the plane of the thin films. 3-D coil 62 allows a unique combination of magnetic functions to be performed with the same coil, many of which can be performed at the same time with the application of a single current pulse. Some of the magnetic tasks that can be accomplished include magnetic saturation of active MTJ elements 51a in the gap between flux concentrators 60, magnetic saturation of passive MTJ elements 51p under flux concentrators 60, magnetic field compensation for external fields acting on active MTJ elements 51a, control of the magnetic fields experienced by active MTJ elements 51a, and control of the magnetic fields experienced by passive MTJ elements 51p.

Another advantage of the 3-D coil design, in combination with controlled placement of the windings relative to the sensor elements, is to enable a high degree of power efficiency while accomplishing the magnetic tasks. For example, the use of 3-D coil 62 encompassing the material of flux concentrators 60 is similar to a coil-wound core of permeable material. The current required to produce a magnetic field in the gap between flux concentrators 60 is substantially less than the current required to create the same magnetic field from a single wire, an in-plan coil structure, or even a 3-D coil with no core material. Further power savings can be realized when multiple magnetic tasks are completed with the same current pulse. For example, the design shown in FIGS. 6A and 6B allows a single pulse to achieve saturation of both active MTJ elements 51a and passive MTJ elements 51p.

The design shown in FIGS. 6A and 6B also illustrates how the placement of the windings of 3-D coil 62 and MTJ elements 51a and 51p creates a device with a very small footprint, since each component of the design is used for multiple purposes. For example, the structure of flux concentrators 60 both shunts field away from passive MTJ elements 51p and acts as a flux concentrator for active MTJ elements 51a, and is also the same structure that acts as a field-enhancing core for coil 62 to produce a localized on-chip field at active MTJ elements 51a. Similarly, coil 62 is a continuous conductor that uses its windings, with flux concentrators 60 as a core, to create strong fields in the gap. The same coil can be used to create a local opposite-direction field under flux concentrators 60, and uses this shielding material directly over the coil under-windings to enhance this field by appropriate control of the distance between the shield 60 and the windings of coil 62 in the direction perpendicular to the plane of the substrate.

The use of 3-D coil 62 also requires less area than a planar coil. In planar coil designs, portions of the "turn-around" windings are generally not useful and require an approximate two to four times increase in the necessary area. By contrast, the return windings of 3-D coil 62 are connected by direct out-of-plane vias with little loss of space to "turn around," making full magnetic use of each winding.

Figure 7A:
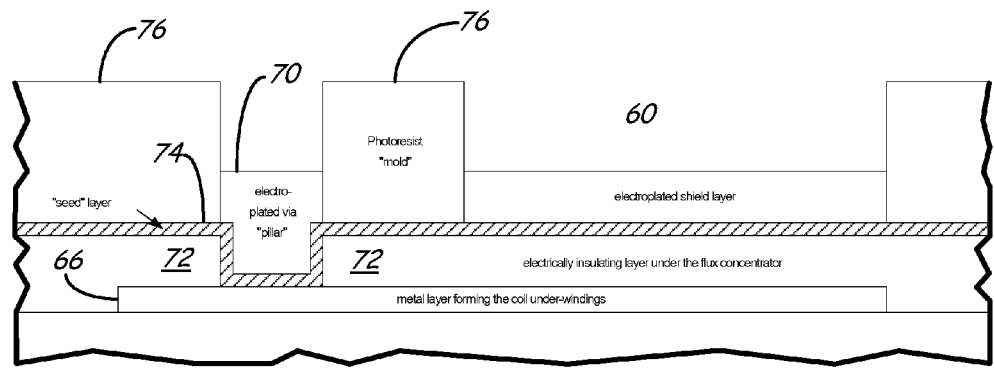
FIG. 7A is a diagram illustrating a first phase of fabricating the 3-D coil of FIG. 6A.
Figure 7B:
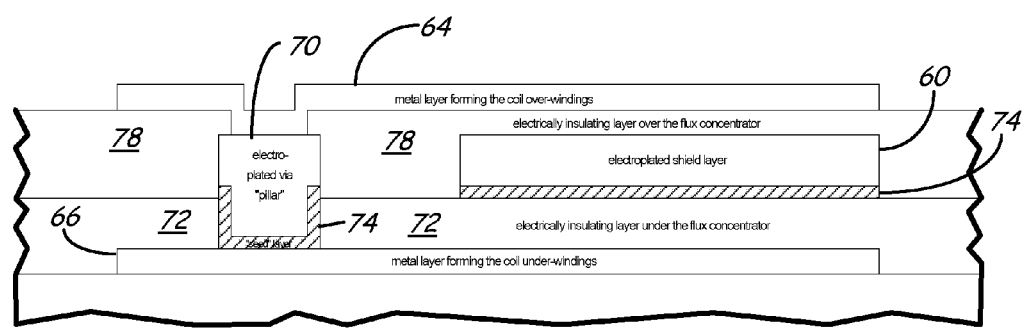
FIG. 7B is a diagram illustrating a second phase of fabricating the 3-D coil of FIG. 6A.

Fabrication of 3-D coil 62 involves construction of high current capacity vias from the under-windings of coil 62 below flux concentrators 60 to the over-windings above flux concentrators 60. The vias are generally deep, due to the fact that they connect metal layers that are separated by the flux concentrator layer and two electrically insulating layers that sandwich the flux concentrator layer. FIGS. 7A and 7B illustrate an exemplary method of fabricating these vias. The method includes an electroplating step that deposits and forms flux concentrators 60, combined with an electroplating process of creating conducting "pillars" 70 between under-windings 66 and over-windings 64. The same patterning and plating step achieves the fabrication of both of these structures. Specifically, FIG. 7A illustrates a first phase of the coil fabrication process. Insulating layer 72 is etched away from the area where the via is to be formed, and seed conducting layer 74 is deposited to enable plating to occur upward through openings in photoresist mask layer 76. Pillar 70 and shield layer 60 are electroplated on exposed portions of seed layer 74. Then, as shown in FIG. 7B, photoresist mask layer 76 is removed, and the exposed portions of seed layer 74 that had been covered by photoresist mask layer 76 are etched away. Insulating layer 78 is then deposited and patterned as shown, and the area over pillar 70 is etched clear. Finally, over-winding metal layer 64 is deposited and patterned, electrically connected to under-winding metal layer 66 by pillar 70 and seed layer 74.

Figure 8:
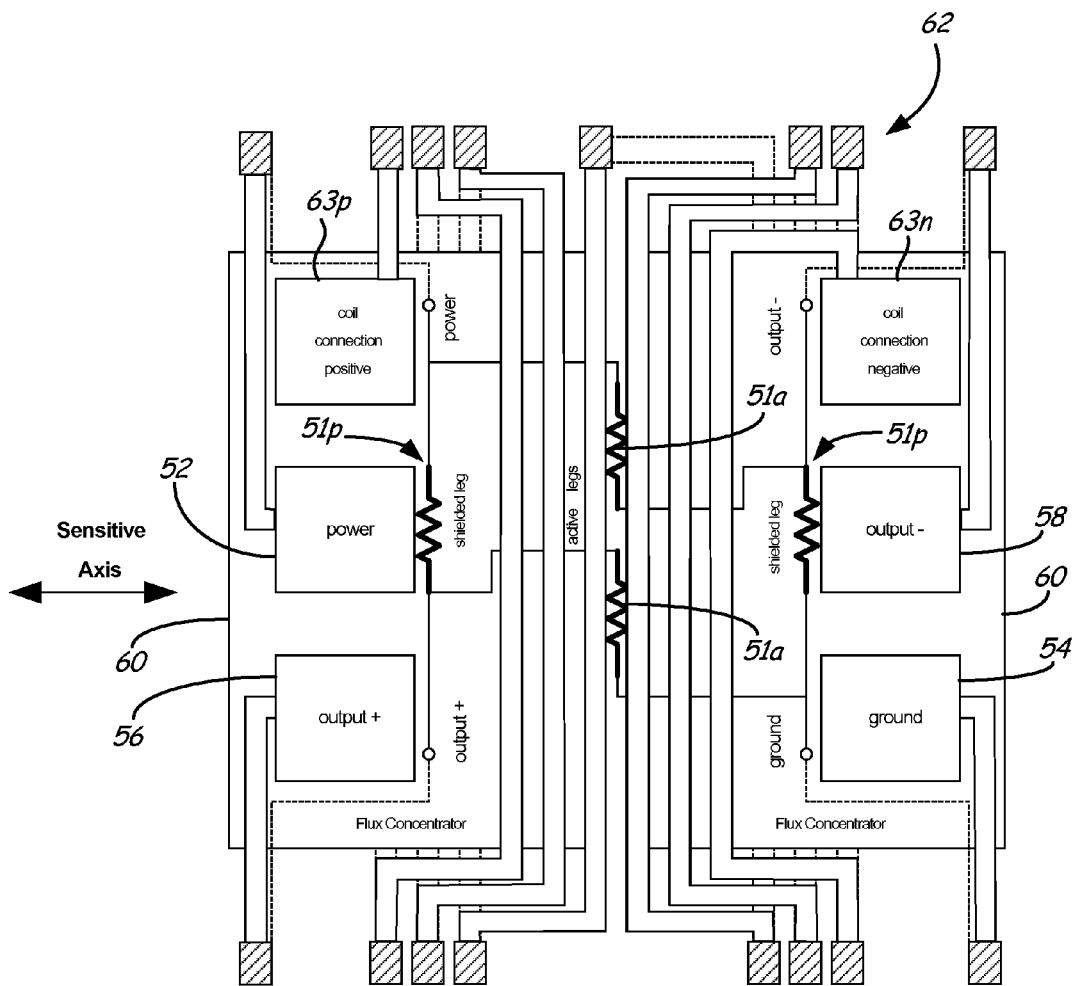
FIG. 8 is a diagram illustrating an example configuration of contact pads stacked above flux concentrators in an MTJ device according to an embodiment of the present invention.

Another advantage of using plated via pillars 70, and sandwiching the flux concentrator layer 60 between insulating layers 72 and 78, is that the same metal that forms over-windings 64 of coil 62 can be used to form conductive bond pads that are located over the top of flux concentrators 60. FIG. 8 illustrates an example configuration in which contact pads 63p (for the positive coil connection), 63n (for the negative coil connection), 52 (the power node), 54 (the ground node), 56 and 58 (the output nodes) are stacked above flux concentrators 60, which creates an MTJ sensor device with a very small footprint, combining the Wheatstone bridge structure shown in FIG. 5B and the 3-D coil structure shown in FIG. 6A. This stacking of structures allows the relatively large areas needed for the bond pads (and the spacing between bond pads) to be shared with the space needed for flux concentrators 60.

The features described above provide a simple means of producing very small MTJ sensor devices. Utilizing these features, a fully functional Wheatstone bridge combined with a 3-D coil design, as generally shown in FIG. 8, was realized in a 0.4 millimeter (mm) by 0.8 mm area. The footprint is dictated only by the six bond pads (four connections to the bridge, two connections to the coil) and the required spacing of those pads.

Power requirements are also reduced by the MTJ sensor device described above in several ways. Coil resistance is decreased by eliminating planar coil "turn around" lengths. Coil efficiency is increased for the fields produced on-chip in the gap between flux concentrators 60, by virtue of the increase in the amount of field that can be generated per unit of current applied due to the use of coils wrapped around a core. Coil efficiency is also increased for the fields produced on-chip at passive MJT elements 51p, by virtue of the presence of shield material 60 above under-windings 66 (positioned at a selected standoff distance), which enhances the field at passive MTJ elements 51p and effectively increases the field per unit of current value here as well.

An MTJ sensor fabricated with this design, having a 3-D coil and a size of 0.4 mm by 0.8 mm, showed excellent performance. Field direction selectivity is achieved, with finite element magnetic field analysis showing field in the sensing direction being amplified 4.3 times, and field perpendicular to the sensing direction being attenuated by a factor of 0.095 times, for a selectivity ratio of 45 times. The insertion of flux concentrators 60 was also found to improve the coil efficiency by over 300% for the field at active MTJ elements 51a (to about 1.3 Oersteds per milli-Ampere (Oe/mA), and by over 50% for the field at passive MTJ elements 51p (to about 0.3 Oe/mA).

Figure 1B:
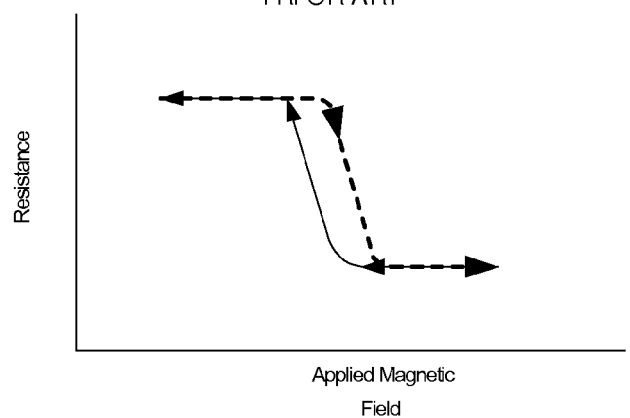
Figure 1C:
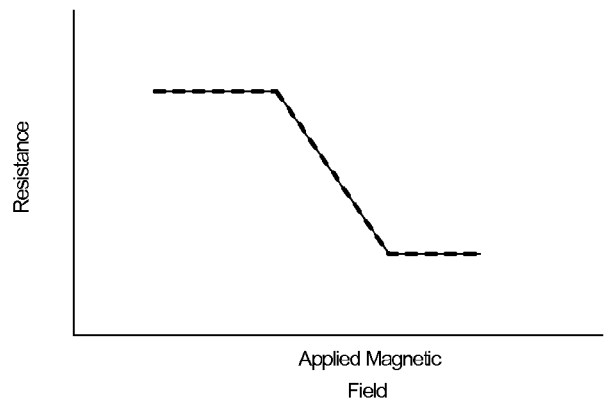
Figure 2:
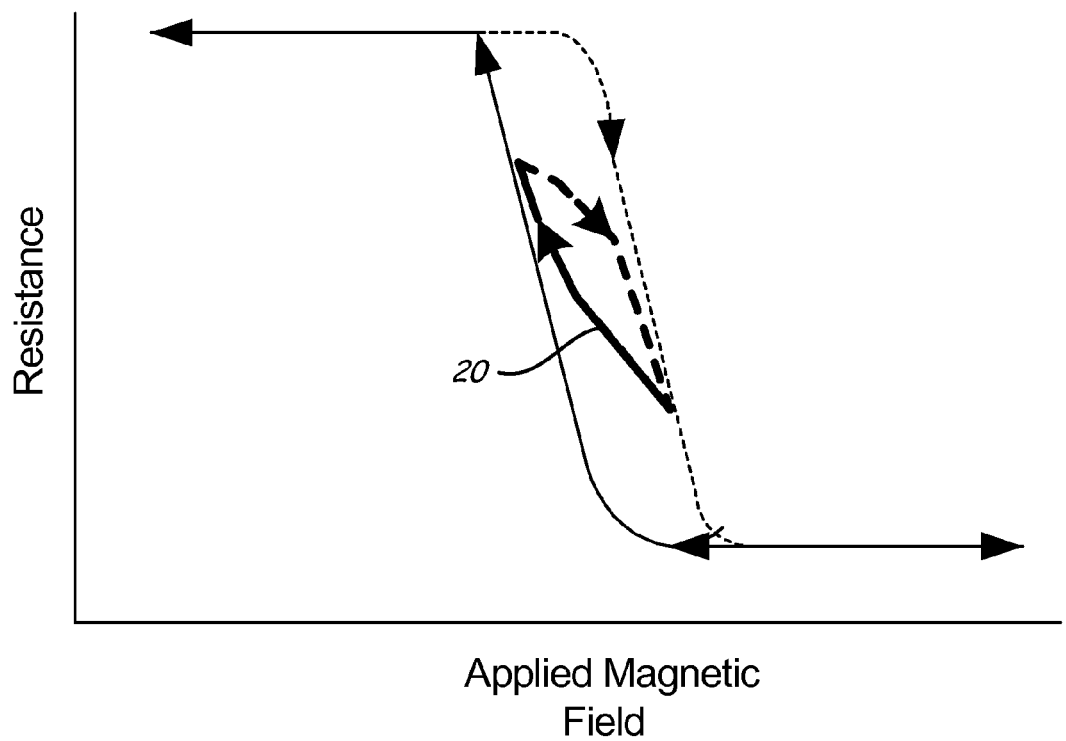
FIG. 2 is a graph of resistance versus applied field in a prior art MTJ sensor having a hysteretic output response.
Figure 3:
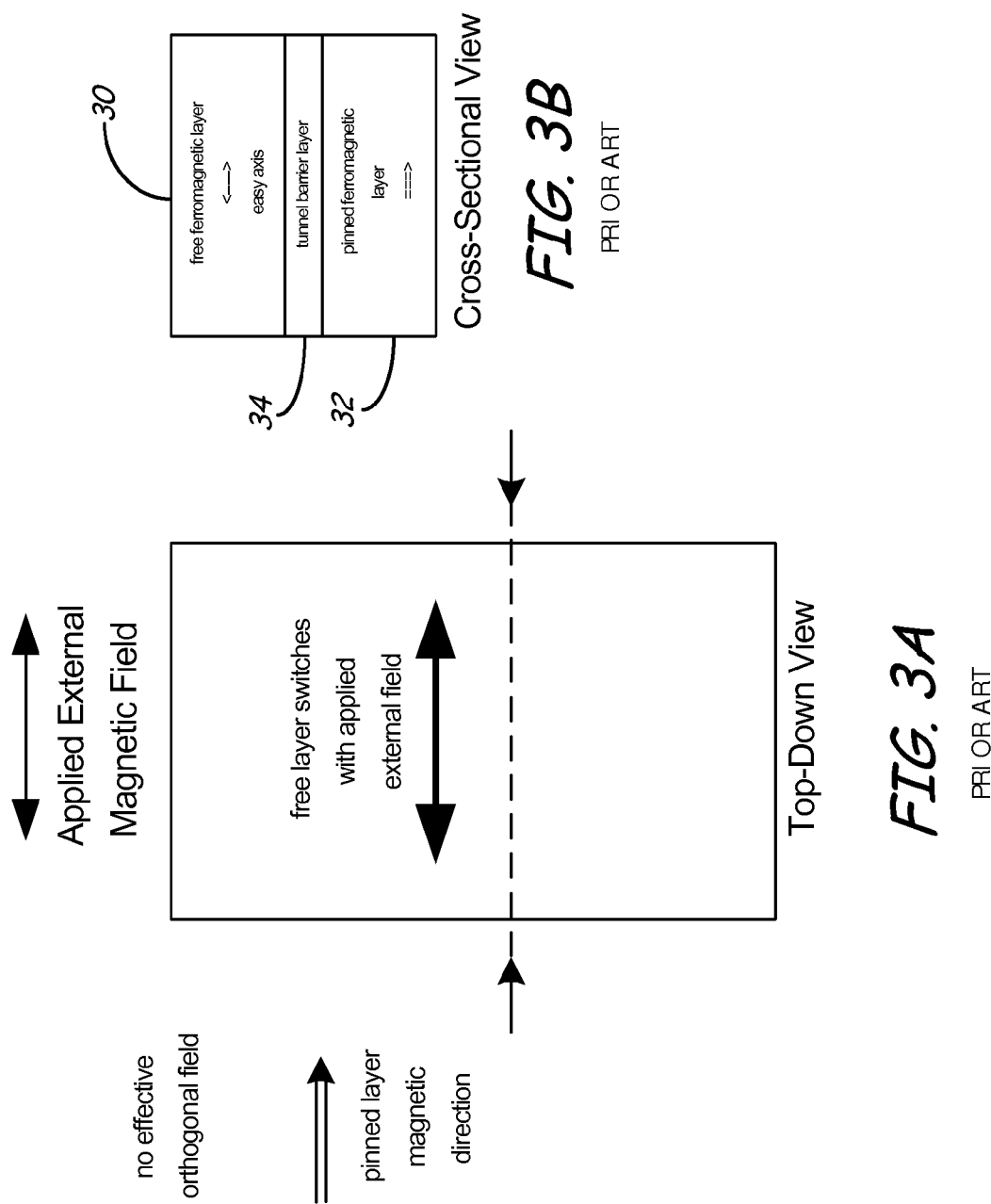
FIG. 3A is a top-down view.
FIG. 3B is a section view, of a prior art sensor configuration, showing the magnetization directions of the layers, with no orthogonal field applied.
Figure 4:
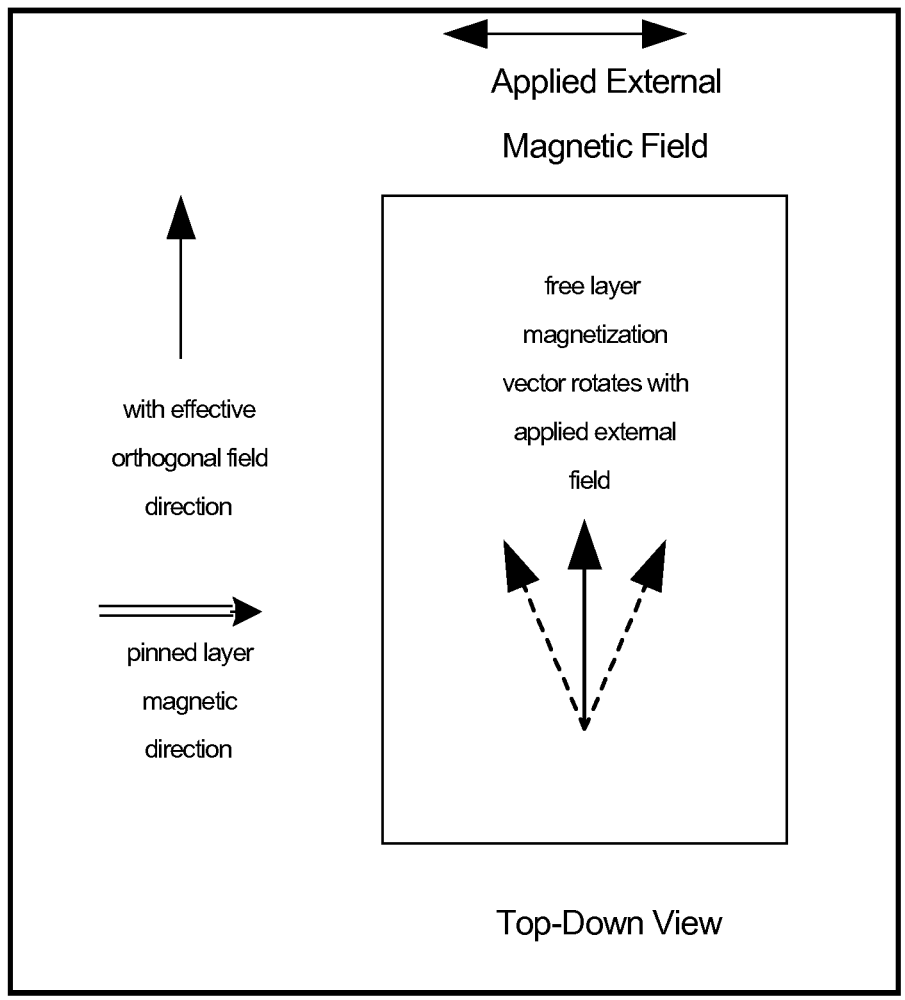
FIG. 4 is a top-down view of an alternative prior art sensor configuration, showing the magnetization directions of the layers, with an effective orthogonal field applied.

Improvements in the performance of an MTJ sensor device are also achieved by a employing a new method of operating the sensor. This mode of operation accurately controls the magnetic history of the sensor, which allows the sensor to perform with a high degree of field resolution. Referring back to FIG. 1A, a sensor having a high amount of hysteresis can be unstable. Referring back to FIG. 1C, a sensor with no hysteresis may have less sensitivity. By controlling the magnetic history of a sensor, a stable, high resolution sensor can be realized from a sensor device having a resistance versus applied field characteristic as shown in FIG. 1B, despite the intrinsic hysteretic characteristics of the sensor.

Figure 9:
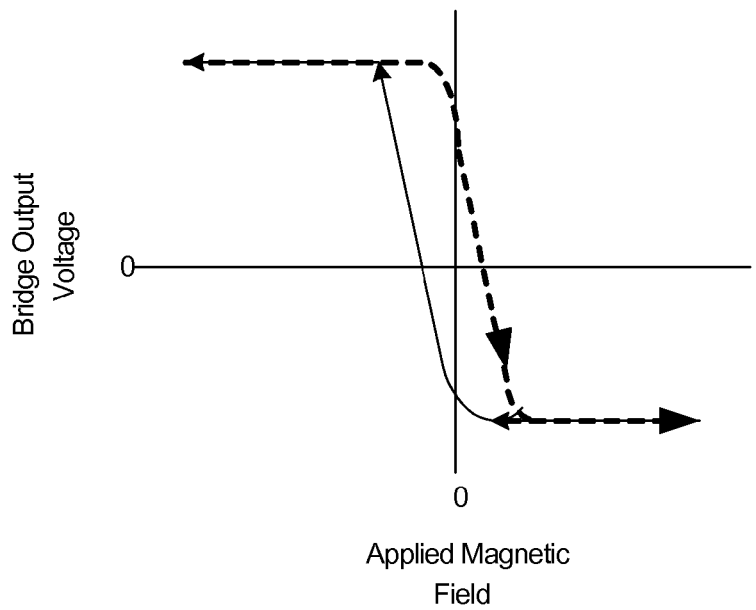
FIG. 9 is a graph illustrating a voltage output curve for a Wheatstone bridge MTJ sensor according to an embodiment of the present invention.

FIG. 9 is a graph illustrating a voltage output curve for a Wheatstone bridge MTJ sensor. The graph of FIG. 9 illustrates balancing of the Wheatstone bridge such that when biased (with a bias voltage between a supply level and ground), the output voltage forms a curve that provides high sensor resolution when operated according to the present invention.

Figure 11A:
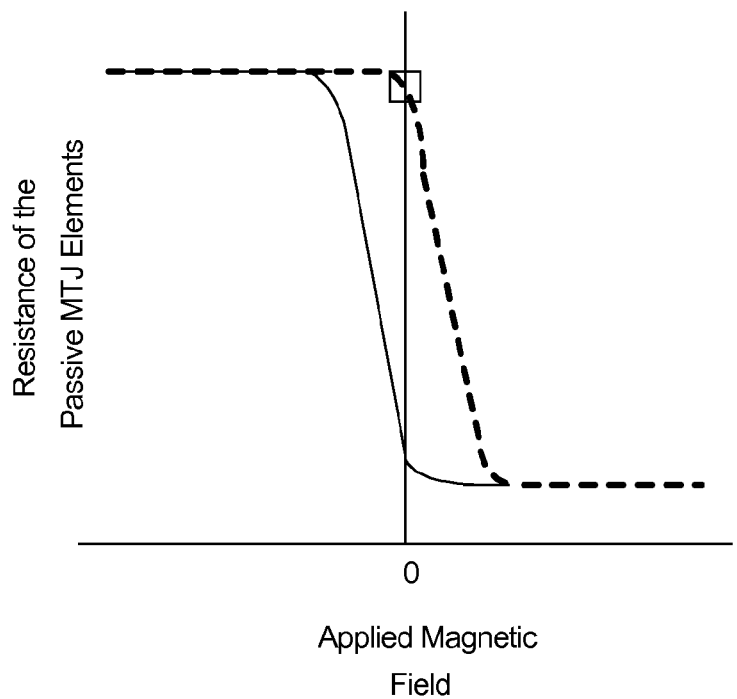
FIG. 11A is a graph illustrating an example of the magnetic states of passive MTJ elements of the MTJ device according to an embodiment of the present invention after a reset current is applied.
Figure 11B:
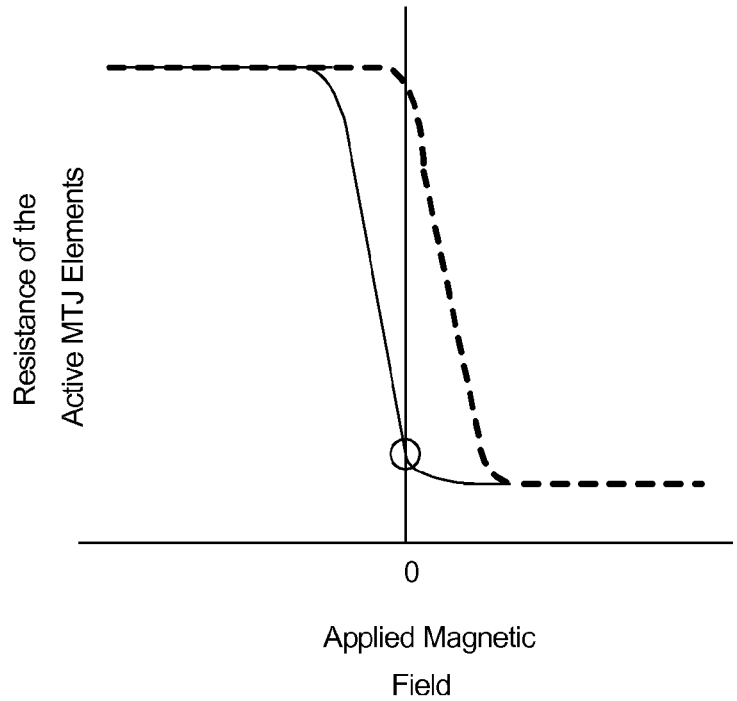
FIG. 11B is a graph illustrating an example of the magnetic states of active MTJ elements of the MTJ device according to an embodiment of the present invention after a reset current is applied.

FIG. 10 is a flow diagram illustrating a method of operating a Wheatstone bridge MTJ sensor having an output characteristic as shown in FIG. 9 in a manner that provides a high resolution, non-hysteretic output according to an embodiment of the present invention. Initially, in step 80, the magnetic history of the sensor is reset. This is accomplished by applying a current pulse in the 3-D coil structure that is sufficient to saturate both the active MTJ elements and the passive MTJ elements. After the saturation current is removed, the magnetic states of the active and passive MTJ elements relax to known values, as shown in FIGS. 11A and 11B. FIG. 11A is a graph illustrating an example of the magnetic states of passive MTJ elements 51p after the reset of step 80 is performed, and FIG. 11B is a graph illustrating an example of the magnetic states of active MTJ elements 51a after the reset of step 80 is performed. With the application of a negative reset current pulse (from the negative coil terminal to the positive coil terminal), passive MTJ elements 51p are driven to their saturated high resistance state, and active MTJ elements 51a are driven to their saturated low resistance state. After the pulse is finished, the magnetic states of passive MTJ elements 51p relax to the position shown by the square in FIG. 11A, and the states of active MTJ elements 51a relax to the position shown by the circle in FIG. 11B. It should be understood that the reset current pulse may also be applied with an opposite polarity in other embodiments, so that passive MTJ elements 51p are driven to a saturated low resistance state and active MTJ elements 51a are driven to a saturated high resistance state, with the same effect; thus, the reset pulse is best understood to drive passive MTJ elements 51p to a first saturated resistance state and to drive active MTJ elements 51a to a second, opposite saturated resistance state.

Figure 12:
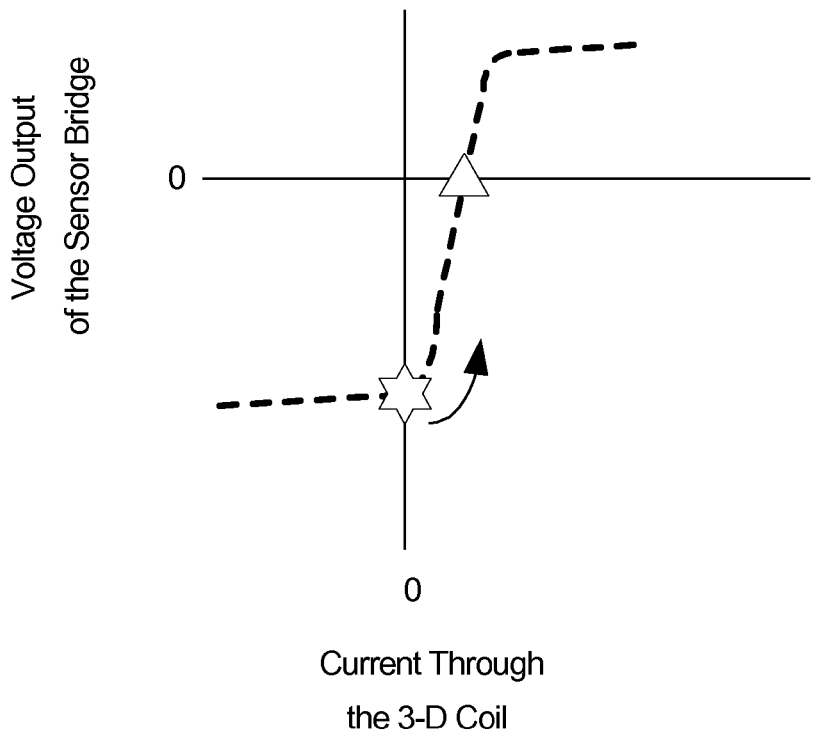
FIG. 12 is a graph of the voltage output of the sensor bridge as current is applied through the 3-D coil, according to an embodiment of the present invention.

Referring again to FIG. 10, next, in step 82, a monotonically increasing current is applied to the 3-D coil. This current monotonically changes the voltage output of the device toward a chosen endpoint, for example, the bridge balanced point (zero voltage point) of the Wheatstone bridge of the sensor. The shape of the voltage response curve is shown in FIG. 12, which is a graph of the voltage output of the sensor bridge as current is applied through 3-D coil 62. The application of positive current through 3-D coil drives the voltage output from the position shown by the star in FIG. 12 to the bridge-balanced point (at zero voltage output, for example) shown by the triangle in FIG. 12.

Figure 13A:
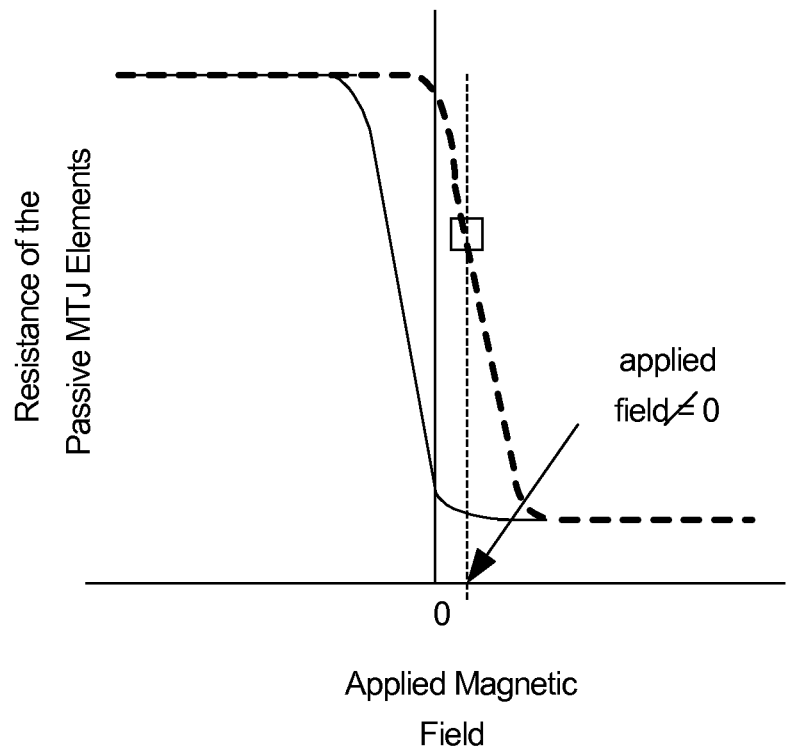
FIG. 13A is a graph of the resistance of passive MTJ elements of an MTJ device according to an embodiment of the present invention versus applied magnetic field.
Figure 13B:
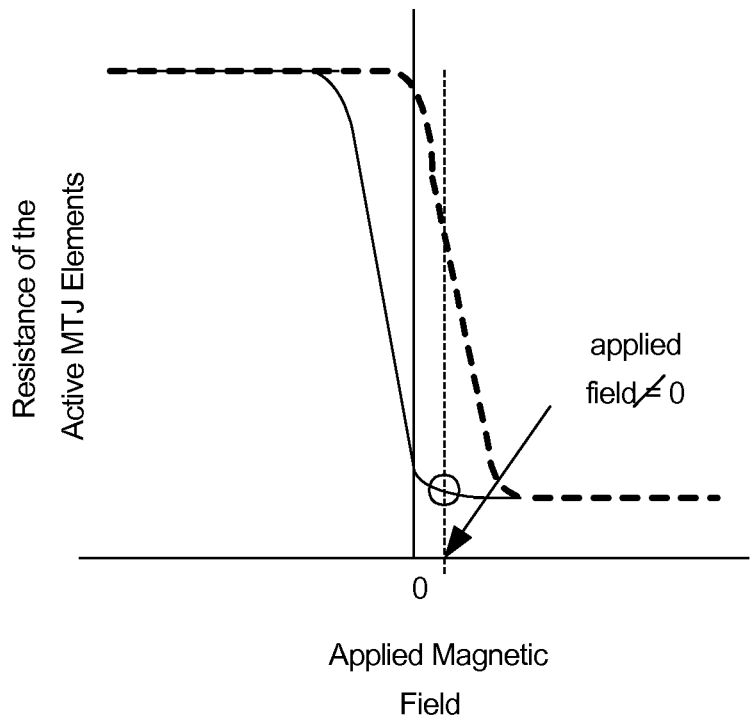
FIG. 13B is a graph of the resistance of active MTJ elements of an MTJ device according to an embodiment of the present invention versus applied magnetic field.
Figure 13C:
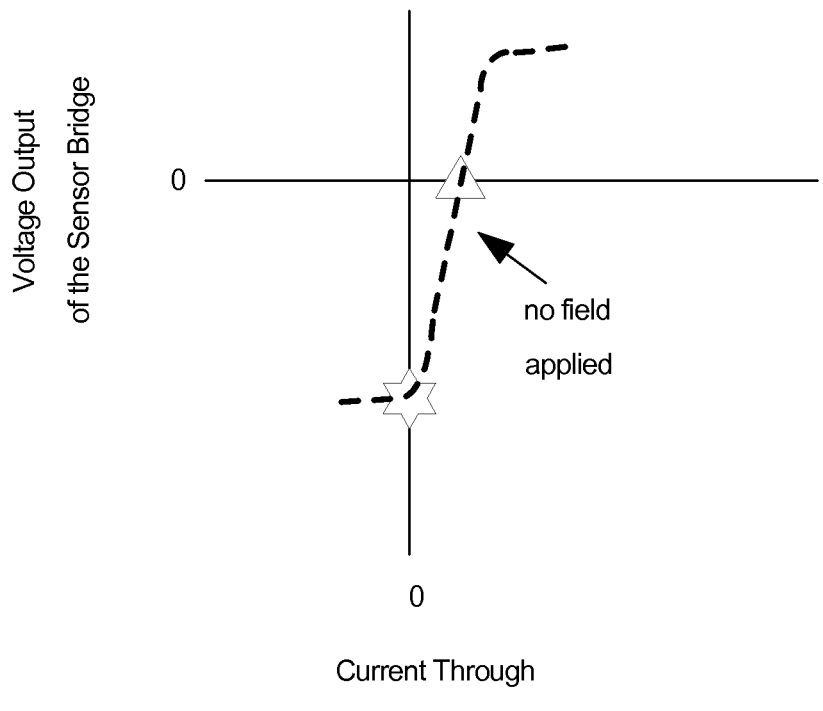
FIG. 13C is a graph of the voltage output of the MTJ sensor bridge versus current through the 3-D coil when no magnetic field is present.
Figure 13D:
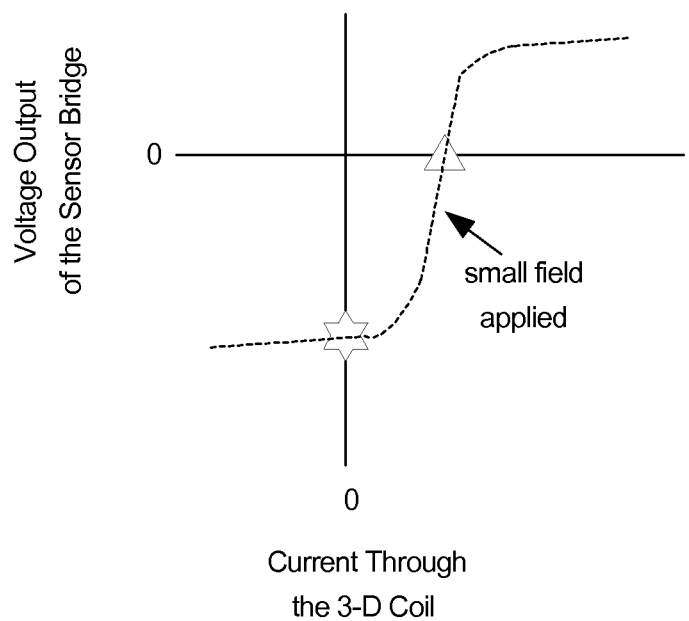
FIG. 13D is a graph of the voltage output of the MTJ sensor bridge versus current through the 3-D coil when a magnetic field is present.

As monotonically increasing current is applied to the 3-D coil, the sensor monitors whether the voltage output of the device has reached the chosen endpoint, as illustrated in decision step 84. As long as the voltage output has not yet reached the endpoint, the current continues to increase monotonically (step 82), and once the voltage output is detected as having reached the endpoint, the value of the current applied to the coil just at that moment is recorded, and this current reading is converted to a corresponding external magnetic field value, as shown in step 86. The current required to reach the voltage output endpoint is a function of the external field to be measured by the sensor, as illustrated in FIGS. 13A, 13B, 13C and 13D. FIG. 13A is a graph of the resistance of passive MTJ elements 51p versus applied magnetic field, and FIG. 13B is a graph of the resistance of active MTJ elements 51a versus applied magnetic field. FIGS. 13C and 13D are graphs of the voltage output of the sensor bridge versus current through 3-D coil 62. As can be seen from FIGS. 13C and 13D, the output voltage, as a function of coil current, changes in the presence of a magnetic field. The curve in FIG. 13C is an example when there is no applied field, and the curve in FIG. 13D is an example when a magnetic field is present (and is different from the curve of FIG. 13C). The amount of current necessary to drive the voltage output to zero is different for the case of no field applied versus a field being present, as shown by the different positions of the triangles in FIGS. 13C and 13D.

The monotonically increasing current ramp applied to the 3-D coil ensures control of the magnetic history of the MTJ sensor in a way that allows reproducible sensor behavior. In particular, the current ramping step should be completed without current reversal. Current reversal in the 3-D coil introduces resistance changes in both the active and passive MTJ elements, affects the voltage endpoint, and reduces the sensitivity of the device. The use of a monotonic current ramp allows the intrinsically hysteretic magnetic sensor elements to be used to make a sensor device that has a reproducible output and a high degree of field sensitivity.

One example of the application of appropriate current ramps in step 82 is to apply a proportional-integral-derivative (PID) control concept. Realizing a high degree of sensitivity means determining with high accuracy the current necessary to bring the voltage output to the desired endpoint. By monitoring the bridge voltage and the error between that voltage and the endpoint, PID control techniques are possible. Slowing down the current ramp as the endpoint is neared allows better discrimination of the value of the endpoint current. Overshoot is not desired if the readout circuit requires a long period of time to determine the endpoint current. However, if the endpoint current value is determined just as the voltage output passes the voltage endpoint value, before current overshoot occurs, then overshoot does not cause a problem, as long as the current ramp was monotonic.

An exemplary initial bridge balance is illustrated in FIG. 9, with the targeted voltage endpoint of step 84 being zero volts (although other voltage targets are possible in other embodiments). For best performance, the voltage endpoint should be located in a region where there is the greatest change in bridge output voltage per unit of on-chip current, so that the control and readout electronics can best leverage the sensitivity of the sensor.

Figure 14A:
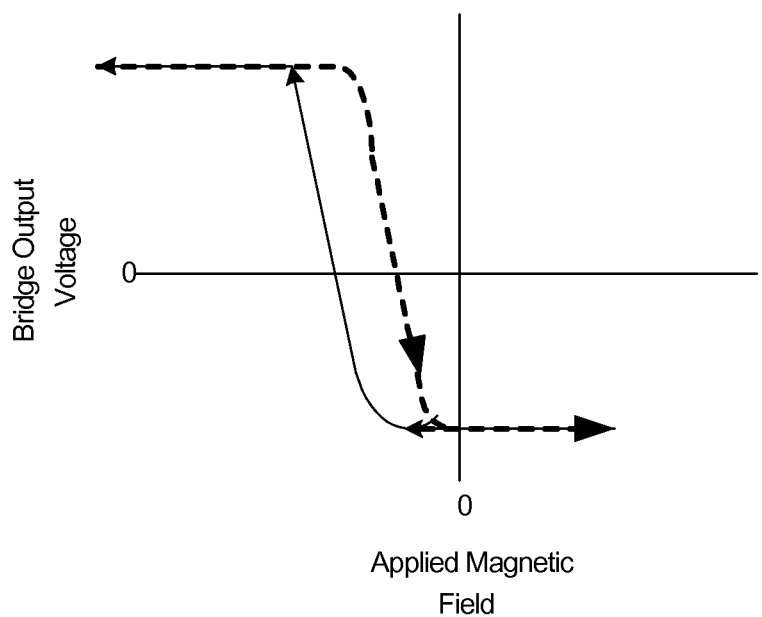
FIG. 14A is a graph illustrating a voltage output curve versus applied magnetic field that is not centered around zero magnetic field.
Figure 14B:
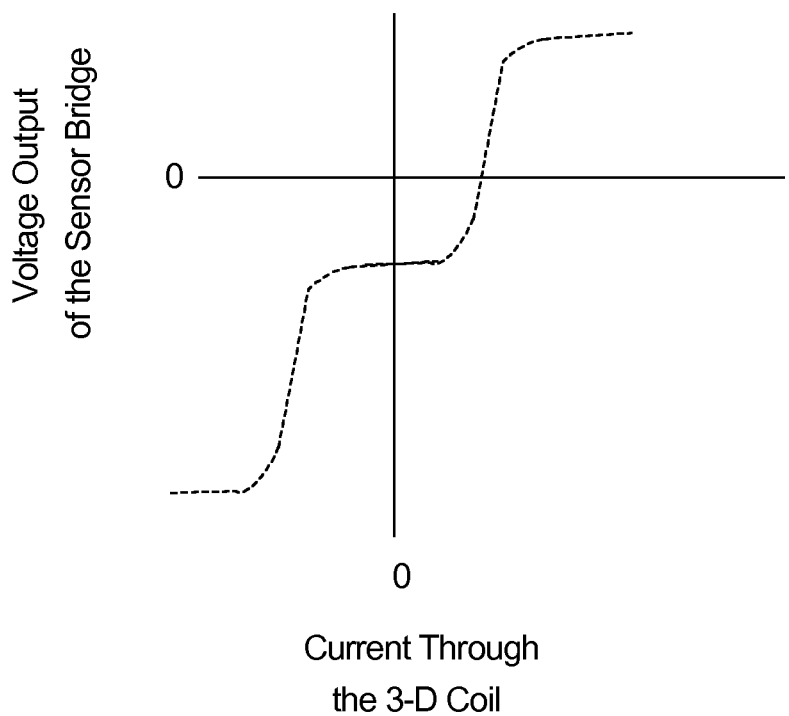
FIG. 14B is a graph illustrating the current required to drive a device having the voltage output curve shown in FIG. 14A to a zero voltage output.

With respect to the magnetic field axis, the smallest power consumption occurs when the sensor output curve is centered. FIG. 14A is a graph illustrating a voltage output curve that is not centered around zero magnetic field, and FIG. 14B is a graph illustrating the current required to drive a device having the voltage output curve shown in FIG. 14A to a zero voltage output, which is shifted to the right. The shift shown in the current curve of FIG. 14B requires a larger current to be used to bring the sensor to a targeted voltage output state, which results in more power being consumed. However, in some embodiments deliberately inducing a magnetic offset can be advantageous. For example, step 82 involves a monotonically changing current sweep. If a single polarity current sweep is generated by control circuitry, then the dynamic range, or range of fields sensed by the device, can be manipulated by controlling the original magnetic offsets of the passive and active MTJ elements. This control of the dynamic range of the sensor may be desirable in some applications.

The output voltage curve, as a function of the 3-D coil current (examples of which are shown in FIGS. 13C, 13D and 14B), are different for different initial states. Therefore, the calibration relationships between the final measured current needed to drive the bridge voltage output to the endpoint and the magnitude of the magnetic field to be measured, are also a function of the initial states. The sensitivity (current per unit field to be measured), linearity and offset of the sensor are functions of multiple factors, including the resistance balance between the active and passive MTJ elements in the bridge, the resistance versus magnetic field characteristics (including magnetic field offset) of each of the elements of the bridge, the range of fields over which the sensor is operable, and the current direction of the reset pulse applied in step 80 (FIG. 10).

Figure 15A:
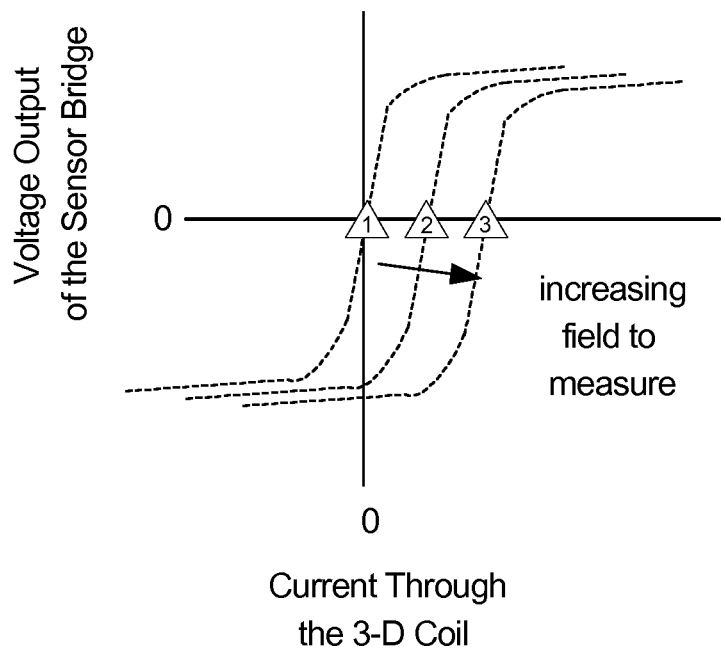
FIG. 15A is a graph illustrating a family of curves representing the bridge voltage output of an MTJ sensor device according to an embodiment of the present invention versus on-chip currents, at three different values of constant magnetic field.
Figure 15B:
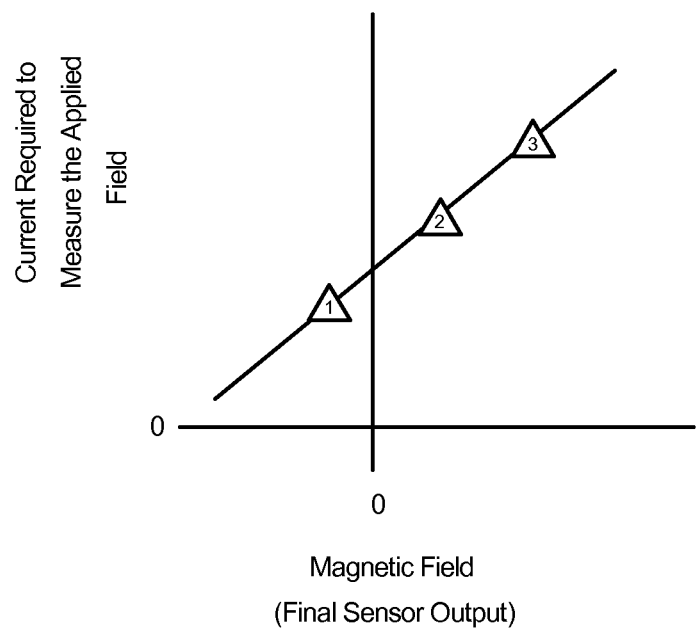
FIG. 15B is a graph illustrating the calibration curve (measured current as a function of magnetic field) for the family of curves shown in FIG. 15A.

FIGS. 15A and 15B illustrate how calibration is performed for an MTJ sensor according to an embodiment of the present invention. FIG. 15A is a graph illustrating a family of curves representing the bridge voltage output of the MTJ sensor device versus on-chip currents, at three different values of constant magnetic field. FIG. 15B is a graph illustrating the calibration curve (measured current as a function of magnetic field) for the family of curves shown in FIG. 15A. The family of curves shown in FIG. 15A occur with an initial state similar to the bridge balance shown in FIG. 9, with the voltage endpoint at zero and located in the middle of the transition between output voltage levels. Converting the measured current value (the value of the on-chip current to bring the bridge output to the endpoint value) to the true magnetic field value requires calibration that involves placing the single-axis sensor device in two or more known field values. The linearity of the output calibration curve can be controlled by controlling the factors noted above. If the output is strongly linear, only a minimal number of calibration measurements are required. Conversely, a highly non-linear curve can be used if a lookup table is provided.

FIG. 15B shows the non-hysteretic final output of the sensor, which is highly desirable. The reset pulse of step 80 (FIG. 10) serves to place the sensor into a known and reproducible magnetic state, such that measurement of any particular field value is independent of the history of field measurements. Magnetic field magnitude readings, in the direction of the sensitive axis of the sensor, are absolute field readings (not relative changes in field), and are reproducible even though the intrinsic magnetic behaviors of the MTJ elements are hysteretic.

Figure 16:
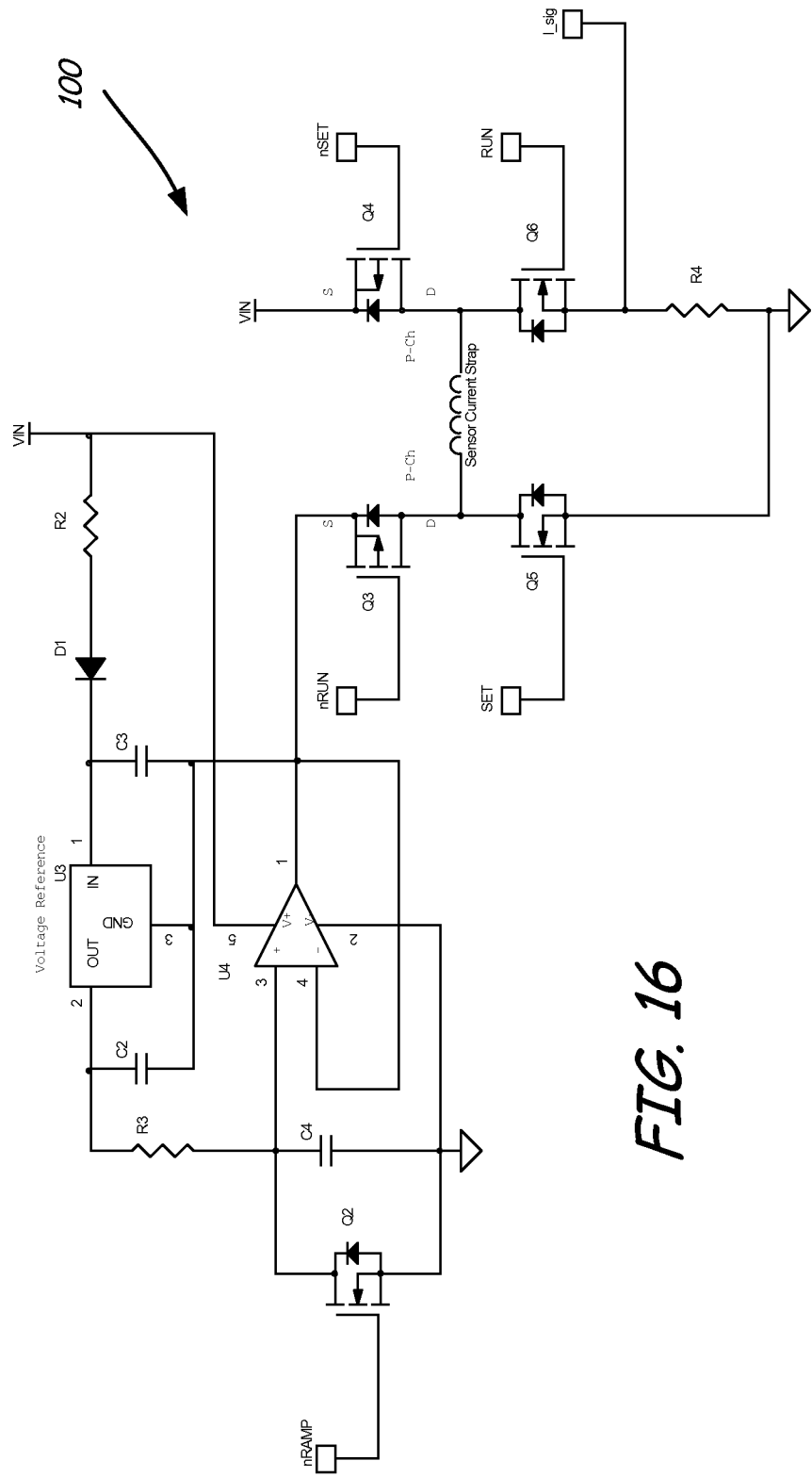
FIG. 16 is a schematic diagram of current strap drive circuitry for use with an MTJ device according to an embodiment of the present invention.
Figure 17:
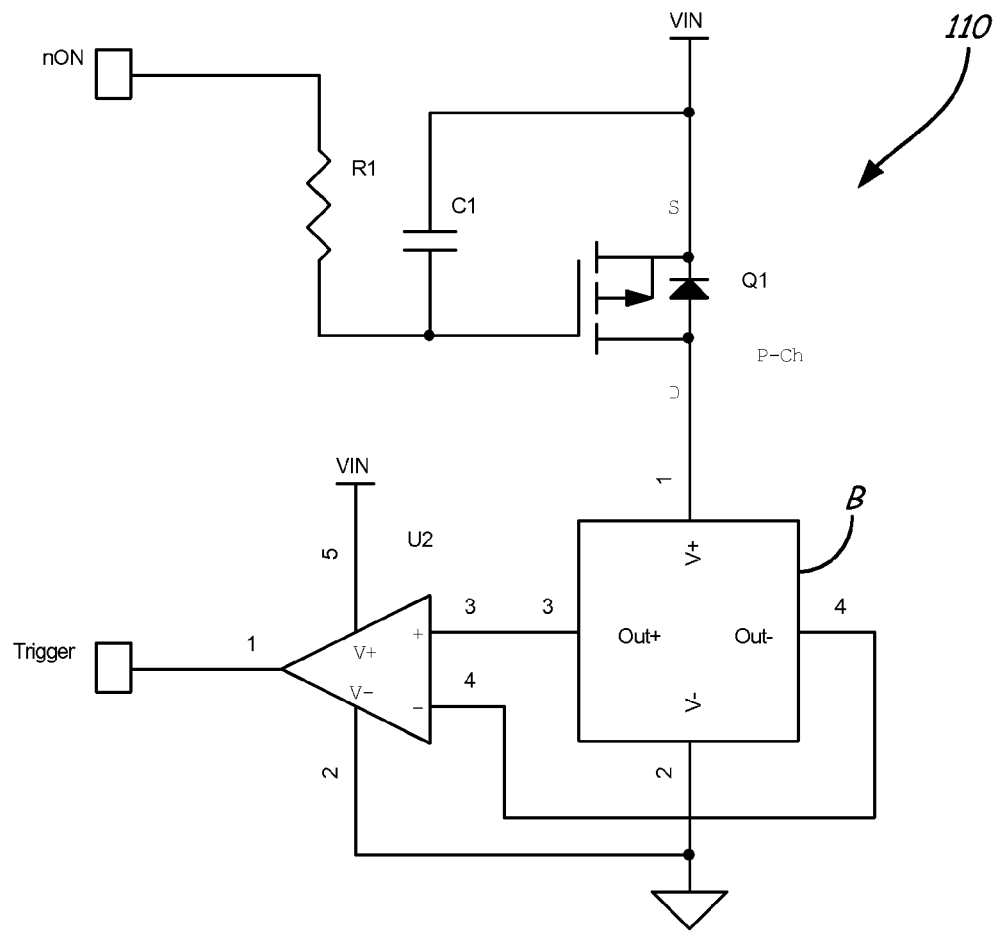
FIG. 17 is a schematic diagram of bridge drive and sensing circuitry for use with an MTJ device according to an embodiment of the present invention.

The sensor design and mode of operation described above is driven by an electronic circuit that supplies a reset current pulse sufficient to magnetically saturate all of the magnetic elements, that supplies a monotonic current ramp (in the opposite polarity of the reset current pulse), that provides a high degree of current control so that there is no polarity reversal during application of current, that provides a sensitive configuration for determining the current value just as it satisfies the endpoint condition, and that converts the measured current value to its corresponding magnetic field value. An example of a suitable circuit implementation is a two-phase configuration shown in FIGS. 16 and 17. FIG. 16 is a schematic diagram of current strap drive circuitry 100, including metal oxide semiconductor (MOS) transistors Q2, Q3, Q4, Q5 and Q6, capacitors C2, C3 and C4, resistors R2, R3 and R4, diode D1, sensor current strap L1, voltage reference U3, and comparator U4, connected as shown in FIG. 16 with respect to voltage rail VIN, ground, and pins nRAMP, I_sig, RUN, nRUN, SET and nSET. FIG. 17 is a schematic diagram of bridge drive and sensing circuitry 110, including MOS transistor Q1, resistor R1, capacitor C1, comparator U2 and bridge circuit B, connected as shown in FIG. 17 with respect to voltage rail VIN, ground, and pins nON and Trigger.

Referring to FIG. 16, current strap drive circuitry 100 first operates in a pre-conditioning phase of a sensing cycle, in which transistors Q4 and Q5 are turned on and transistors Q3 and Q6 are turned off, so that current flows through current sensor strap L1. In a second phase of the cycle, transistors Q3 and Q6 are turned on, and transistors Q4 and Q5 are turned off. In this phase, current can flow in the opposite direction through the series connection of sensor current strap L1 and sensing resistor R4. To initiate a measurement phase, transistor Q2 is turned off. This allows the voltage on the source of transistor Q3 to begin to ramp up, with a corresponding ramp in current through sensor current strap L1.

Referring to FIG. 17, bridge drive and sensing circuitry 110 powers the bridge sensor and detects polarity transitions in the bridge output during the second phase of the sensing cycle. Following the pre-conditioning current pulse, the bridge output is negative and the output of comparator U2 (at pin Trigger) is low. During the second phase, as the strap current is ramping up, the bridge output begins to increase. Once the bridge output crosses zero, the comparator output goes high. A high comparator output is the trigger signal for reading the strap current (pin I_sig in FIG. 16). The low-to-high transition at pin Trigger also marks the end of the two-phase sensing cycle.

Quantitative Explanation of Operation of Sensor

In order to more completely understand the operation of the MTJ sensor described above, a quantitative explanation is now provided. It should be understood that any specific examples provided in this quantitative explanation are intended to show examples of particular embodiments, and should not be construed to limit the overall scope of the present invention.

Figure 18:
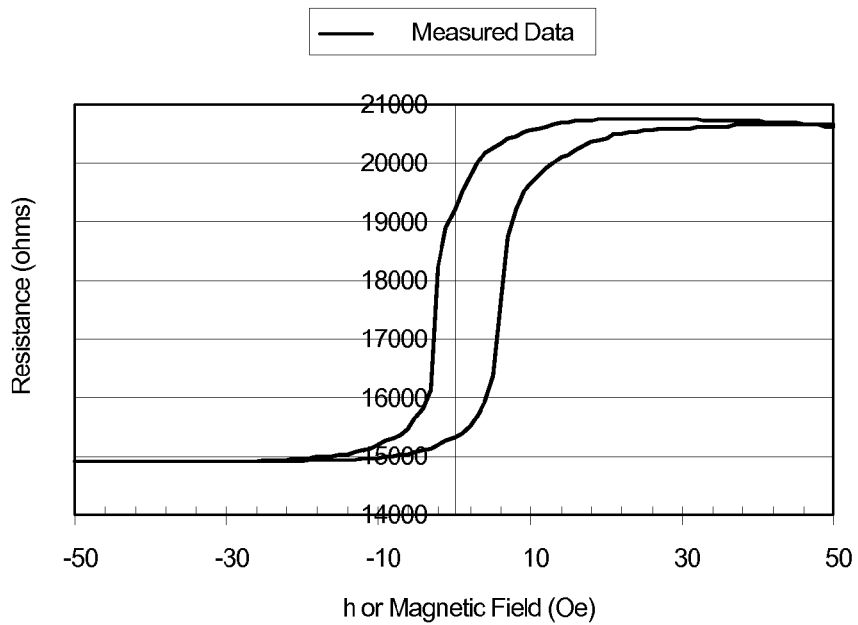
FIG. 18 is a graph illustrating a measured resistance versus applied field curve for an exemplary sensor.

The typical resistance of an MTJ sensor device forms a hysteretic "S-like" function with applied magnetic field. FIG. 18 is a graph illustrating a measured resistance versus applied field curve for an exemplary sensor, exhibiting the expected shape and hysteretic response.

Figure 19:
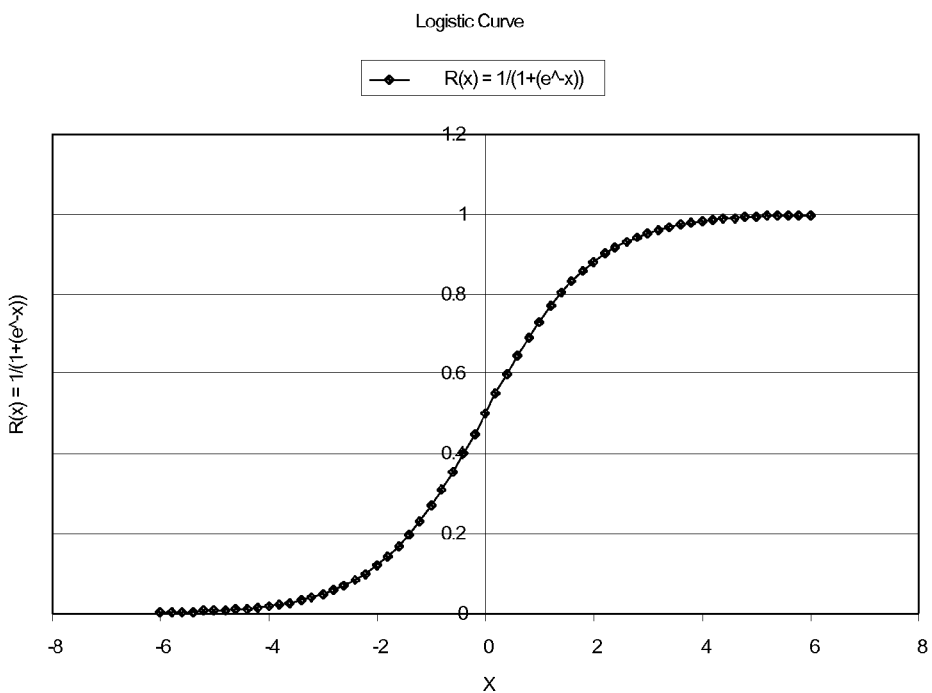
FIG. 19 is a graph illustrating the "S-like" shape of a logistic curve.

The resistance versus field characteristic can be described with some degree of accuracy with a logistic curve. FIG. 19 is a graph illustrating the "S-like" shape of the logistic curve. The general form of a logistic equation is as follows:

$$R(x) = \frac{1}{1+e^{-x}} \quad \text{Eq. 1}$$

Specific to the case of an MTJ resistance output, two different logistic functions can be used to model the two hysteretic sides of the resistance output curve. The fitting curves are given by the following function:

$$R(h) = C\left(1 + \frac{MR}{1+e^{-(h-OS)/B}}\right) \quad \text{Eq. 2}$$

where R is the resistance (Ohms), h is the applied magnetic field (Oerstads), C is the low-state resistance value (Ohms), MR is the magnetoresistance (defined as the change in resistance from the low-state resistance divided by the low-state resistance), OS is the offset field (Oerstads), which is a fitting parameter to shift the curve, and B is a shape fitting parameter which defines how sharp the transition is (Oerstads). Each "positive-going" or "negative-going" side of the measured data is represented by its own equation, but the parameters C, MR and B are the same for each curve. The only difference between the two curves is the offset value OS, since each curve has its own offset value to correspond to the hysteretic character of the data.

Figure 20:
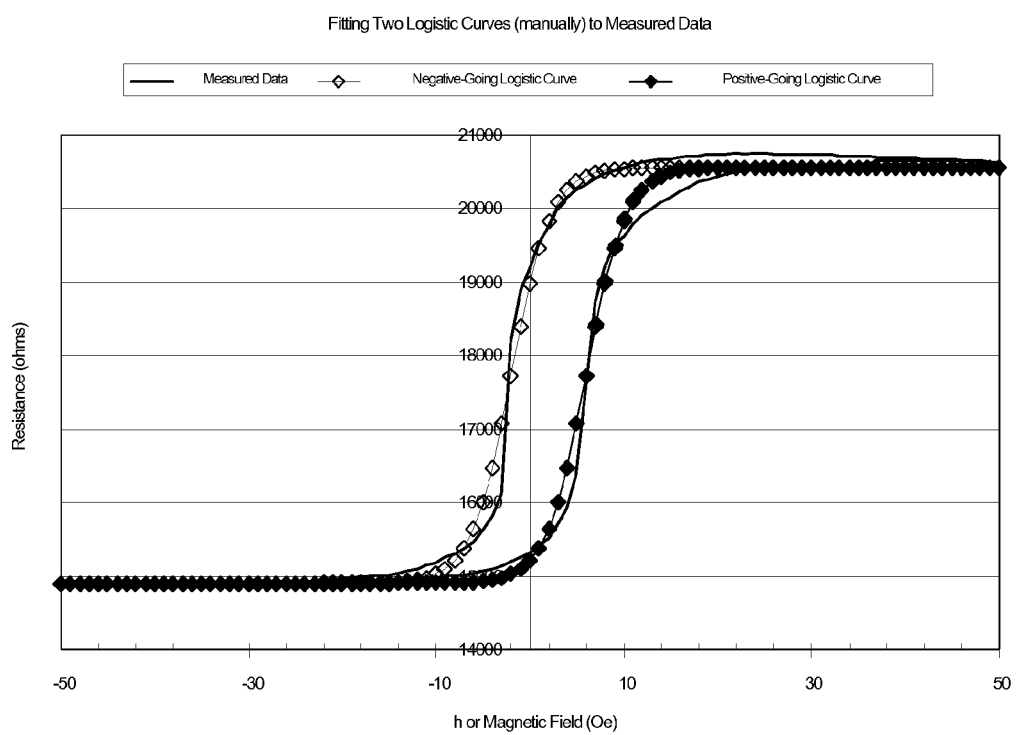
FIG. 20 is a graph illustrating the result of fitting two curves to the measured resistance versus field characteristic shown in FIG. 18.

FIG. 20 is a graph illustrating the result of fitting two curves to the measured resistance versus field characteristic shown in FIG. 18. The values of the parameters for the fit shown in FIG. 20 are as follows:

| "positive-going" side | "negative-going" side |
|---|---|
| C = 14900 ohms | C = 14900 ohms |
| MR = 0.38 | MR = 0.38 |
| B = 2.1 Oe | B = 2.1 Oe |
| OS1 = 6 Oe | OS2 = −2 Oe |

The resistance functions described above are applicable to the MTJ elements of the Wheatstone bridge MTJ sensor shown in FIGS. 5A and 5B, which includes two active MTJ elements 51a and two active MTJ elements 51p. For ease of understanding, both active MTJ elements 51a will be represented by a single resistance function, and both passive MTJ elements 51p will be represented by a single resistance function different from the function used for active MTJ elements 51a. The sensor will be considered for purpose of this example as operating with a desired balance point of the bridge output being zero volts.

The step of resetting the magnetic history of the MTJ sensor device (step 80, FIG. 10) saturates the active resistors (MTJ elements 51a) and the passive resistors (MTJ elements 51p) in opposite field directions. This, together with the monotonic increase in on-chip coil increase (step 82, FIG. 10) ensures that the operating curves for each leg of the sensor can be represented by the following two equations:

$$\text{Active legs:} \quad R_{Aext}(h) = C\left(1 + \frac{MR}{1+e^{-(h-OS_{Aext})/B_{Aext}}}\right) \quad \text{Eq. 3}$$

$$\text{Passive legs:} \quad R_{Pext}(h) = C\left(1 + \frac{MR}{1+e^{-(h-OS_{Pext})/B_{Pext}}}\right) \quad \text{Eq. 4}$$

where the variable labels are adjusted to reflect the response to applied external fields. A field applied external to the flux concentrators/shields of the sensor will have an amplified effect on the resistance of the active legs (due to the flux concentrator effect on active MTJ elements 51a) and an attenuated effect on the resistance of the passive legs (due to the shield effect on passive MTJ elements 51p). Because of this, the two resistance response functions of equations 3 and 4 have different factors for B ($B_{Aext}$ and $B_{Pext}$) and for the offset values ($OS_{Aext}$ and $OS_{Bextt}$).

If the MTJ sensor is placed in a constant magnetic field that is to be measured ($h_{meas}$), and is reset as described in step 80 (FIG. 10), then the resulting initial resistances of the legs of the bridge are given by the following equations:

$$\text{Initial } R \text{ of active legs: } R_{Aext}(h_{meas}) = \quad \text{Eq. 5}$$
$$C\left(1 + \frac{MR}{1+e^{-(h_{meas}-OS_{Aext})/B_{Aext}}}\right)$$

$$\text{Initial } R \text{ of passive legs: } R_{Pext}(h_{meas}) = \quad \text{Eq. 6}$$
$$C\left(1 + \frac{MR}{1+e^{-(h_{meas}-OS_{Pext})/B_{Pext}}}\right)$$

At this point, the bridge is not balanced and the output of the bridge is non-zero. Next, the current through the on-chip coil (3-D coil 62, FIG. 6A) is increased monotonically to produce internal fields which serve to change the resistances of the MTJ elements and rebalance the bridge. It should be understood that the on-chip coil produces fields that are not amplified by the flux concentrator effect nor attenuated by the shield effect in the way that external fields are. A new set of equations are used to represent the resistance changes to the internal fields. The low-state resistance constant C and the magnetoresistance MR remain unchanged, but the shapes of the new curves require new B and OS fitting parameters:

$$\text{Internal field response,} \quad \text{Eq. 7}$$
$$\text{active legs:} \quad R_{Ain}(h) = C\left(1 + \frac{MR}{1+e^{-(h-OS_{Ain})/B_{in}}}\right)$$

$$\text{Internal field response,} \quad \text{Eq. 8}$$
$$\text{passive legs:} \quad R_{Pin}(h) = C\left(1 + \frac{MR}{1+e^{-(h-OS_{Pin})/B_{in}}}\right)$$

The offset parameters ($OS_{Ain}$ and $OS_{Pin}$) are different for the active and passive legs of the bridge, but the shape fitting parameter for the internal field case ($B_{in}$) is the same for both the active and passive legs. For a given current through the on-chip coil, the field produced near active MTJ elements 51a is different than the field produced near passive MTJ elements 51p, but the ideal response functions of the resistance to field are not different.

The initial resistance values under the applied field to be measured must match using either the external field description or the internal field description:

$$\text{Active legs:} \quad R_{Aext}(h_{meas}) = R_{Ain}(h_{A0in}) \quad \text{Eq. 9}$$

$$\text{Passive legs:} \quad R_{Pext}(h_{meas}) = R_{Pin}(h_{P0in}) \quad \text{Eq. 10}$$

where $h_{A0in}$ and $h_{P0in}$ are the internal fields that would produce equivalent resistances to the application of an external field $h_{meas}$.

It is useful later to represent for $h_{A0in}$ and $h_{P0in}$ in terms of $h_{meas}$. To do this, equations 5 and 7, and 6 and 8 are compared, and result in:

Active legs: $(h_{meas} - OS_{Aext})/B_{Aext} = (h_{A0in} - OS_{Ain})/B_{in}$    Eq. 11 or $$h_{A0in} = \frac{B_{in}}{B_{Aext}}(h_{meas} - OS_{Aext}) + OS_{Ain}$$

Passive legs: $(h_{meas} - OS_{Pext})/B_{Pext} = (h_{P0in} - OS_{Pin})/B_{in}$    Eq. 12 or $$h_{P0in} = \frac{B_{in}}{B_{Pext}}(h_{meas} - OS_{Pext}) + OS_{Pin}$$

To bring the bridge back to a balance condition with zero voltage output, the resistance of the active legs must equal the resistance of the passive legs. The field values $h_{AZin}$ and $h_{PZin}$ are used to express the internal fields produced by the on-chip coil to bring the bridge output to zero, as represented in the following set of equations:

$$R_{Ain}(h_{AZin}) = R_{Pin}(h_{PZin}) \text{ or}$$ Eq. 13

$$C\left(1 + \frac{MR}{1 + e^{-(h_{AZin} + h_{A0in} - OS_{Ain})/B_{in}}}\right) =$$
$$C\left(1 + \frac{MR}{1 + e^{-(h_{PZin} + h_{P0in} - OS_{Pin})/B_{in}}}\right) \text{ or}$$

$$(h_{AZin} + h_{A0in} - OS_{Ain})/B_{in} = (h_{PZin} + h_{P0in} - OS_{Pin})/B_{in} \text{ or}$$

$$h_{AZin} - h_{PZin} = h_{PA0in} - h_{A0in} + OS_{Ain} - OS_{Pin}$$

Using the relationships found in equations 11 and 12, the result is:

$$h_{AZin} - h_{PZin} = \frac{B_{in}}{B_{Pext}}(h_{meas} - OS_{Pext}) - \frac{B_{in}}{B_{Aext}}(h_{meas} - OS_{Aext})$$ Eq. 14

Since the same current $I_z$ (the current value to "zero" the bridge) produces both $h_{AZin}$ and $h_{PZin}$, it is useful to define yet another set of parameters, coil efficiency factors $f_{Ain}$ and $f_{Pin}$. These factors describe how much field is produced by the on-chip coil at the active and passive MTJ elements (respectively) for a given current value. The efficiency factors used here will be in units of Oe/mA. Recall that when operating the Split-Field Mode device, the fields produced for the active legs is opposite in sign to the fields produced for the passive legs.

$h_{AZin} = f_{Ain} I_z$ and $h_{PZin} = f_{Pin} I_z$ such that $$h_{AZin} - h_{PZin} = I_z(f_{Ain} - f_{Pin})$$ Eq. 15

Combining equations 14 and 15 gives:

$$I_z = h_{meas}\left[\frac{\left(\frac{B_{in}}{B_{Pext}} - \frac{B_{in}}{B_{Aext}}\right)}{(f_{Ain} - f_{Pin})}\right] +$$
$$\left[\frac{1}{(f_{Ain} - f_{Pin})}\right]\left[\frac{B_{in}}{B_{Aext}}(OS_{Aext}) - \frac{B_{in}}{B_{Pext}}(OS_{Pext})\right]$$ Eq. 16

What equation 16 shows is that the current needed to zero the bridge is ideally linear with respect to the applied fields to measure. While each of the legs of the bridge shows an intrinsic resistance versus field response that is not linear (see for example FIG. 18), the output of the MTJ sensor is linear with applied field. And while other magnetic sensors have feedback schemes that also exploit the linearity of a field-producing current strap, hysteresis is commonly still present, and the hysteresis compromises the sensitivity. Here, by using the MTJ sensor described above, the result is linear and the sensitivity is maintained by rigid control of the magnetic history of the device during operation (via the reset step and the monotonically increasing current sweep to find the voltage nulling point described above with respect to FIG. 10). This creates an ideal situation where there is no hysteresis in the output values (equation 16 is not double valued), and yet exploits the high sensitivity of intrinsically hysteretic MTJ elements.

Equation 16 also allows determination of the sensitivity S (current versus magnetic field) which is the derivative with respect to the applied field, $d_{Iz}/d_{hmeas}$. Equation 17 shows the result:

$$S = \frac{\left(\frac{B_{in}}{B_{Pext}} - \frac{B_{in}}{B_{Aext}}\right)}{(f_{Ain} - f_{Pin})}$$ Eq. 17

Current vs. magnetic field (sensitivity):
Exemplary values of these parameters representative for an MTJ sensor designed as described above are as follows:
  $B_{Aex}$ ~2 Oe
  $B_{Pex}$ ~130 Oe
  $B_{in}$ ~14 Oe
  $f_{Ain}$ ~1.3 Oe/mA
  $f_{Pin}$ ~−1 Oe/mA This means that the sensitivity for a design according to an exemplary embodiment of the present invention is ~|3 Oe/mA|. Measured sensitivity values were very close to 3 Oe/mA for many of the preliminary MTJ sensors that were fabricated and tested, agreeing with the expected value.

Examining equation 17, it can be seen that the sensitivity is increased under the following conditions:
  When the internal field magnetic transitions are broad.
  When the external field magnetic transitions are steep.
  When the field efficiencies (opposite in sign due to the configuration of the MTJ sensor) are low.

The second point above is equivalent to saying that the flux concentrators should have a high amplification effect. The third point above shows the design tradeoff concerning sensitivity and power consumption. A low coil efficiency means high resolution of fields to measure, but also high power requirements for the coil.

The offset of the sensor is expressed by:

$$I_{Zoffset} = \left[\frac{1}{(f_{Ain} - f_{Pin})}\right]\left[\frac{B_{in}}{B_{Aext}}(OS_{Aext}) - \frac{B_{in}}{B_{Pext}}(OS_{Pext})\right]$$ Eq. 18 which is the current required to zero the bridge even when there is no external field to measure. This offset doesn't affect sensitivity, but does represent "wasted" power consumption. The offset can be reduced by:
  Increasing the efficiencies (field/current) of the on-chip coil at the active and passive devices.
  Creating sharper magnetic transitions with respect to the internal fields, and broader magnetic transitions with respect to the external fields.
  Reducing the offset values as expressed by the resistance changes with respect to external fields.

The first two points above again show the design tradeoff between low power and high sensitivity. The third point above is further understood by acknowledging that if the Wheatstone bridge uses passive and active legs, then the passive legs (shielded) will always produce a $B_{Pext}$ that is greater than $B_{Aext}$. This implies that to minimize power consumption, attention should focus on reducing the offset value of the resistance function, $OS_{Aext}$, of the active legs.

The MTJ sensor structure and operation described herein has been shown to provide a sensor with high resolution and low hysteresis, and is able to be fabricated with a small footprint as well. This is achieved, at least in part, by configuring the sensor as a Wheatstone bridge that includes a three-dimensional coil wrapped around magnetic elements that function both as both shields for the passive elements of the bridge and as flux concentrators for the active elements of the bridge. In addition, the performance of the sensor is achieved, at least in part, by applying a reset current pulse through the three-dimensional coil to reset the magnetic history of the sensor, to eliminate the hysteretic behavior of the sensor even though the underlying magnetic elements of the sensor are hysteretic in nature.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A magnetic tunnel junction (MTJ) sensor comprising:
a bridge comprising first and second active MTJ elements and first and second passive MTJ elements connected in a Wheatstone bridge configuration;
first and second magnetic shield elements located over the first and second passive MTJ elements and forming a gap therebetween that concentrates magnetic flux toward the first and second active MTJ elements, which are located below the first and second magnetic shield elements in the gap therebetween; and
a three-dimensional coil wound around and insulated from the first and second magnetic shield elements with over-windings located over the first and second magnetic shield elements and under-windings located under the first and second magnetic shield elements, connected together by a plurality of vias adjacent the first and second magnetic shield elements.

2. The MTJ sensor of claim 1, wherein the three-dimensional coil has a positive terminal and a negative terminal, and the bridge comprises a positive output node, a negative output node, a power node and a ground node.

3. The MTJ sensor of claim 2, further comprising contact pads located over the top of the first and second magnetic shield elements for connection to the positive terminal and the negative terminal of the three-dimensional coil and the positive output node, the negative output node, the power node and the ground node.

4. The MTJ sensor of claim 3, wherein the contact pads are formed of the same metal layer that forms the over-windings of the three-dimensional coil.

5. The MTJ sensor of claim 1, further comprising circuitry connected to the bridge configured to:

supply a reset current pulse through the three-dimensional coil sufficient to magnetically saturate the first and second active MTJ elements and the first and second passive MTJ elements;
supply a monotonically increasing current with a polarity opposite to the reset current pulse through the three-dimensional coil; and
determine a value of current through the three-dimensional coil when an output voltage of the bridge reaches an endpoint.

6. The MTJ sensor of claim 5, further comprising circuitry operable to convert the determined value of the current through the three-dimensional coil when the output voltage of the bridge reaches the endpoint into a corresponding value of magnetic field based on previous calibration of the MTJ sensor.

7. The MTJ sensor of claim 5, wherein the endpoint is a zero volts output voltage of the bridge.

8. The MTJ sensor of claim 5, wherein the reset current pulse drives the first and second active MTJ elements to a saturated first resistance state and drives the first and second passive MTJ elements to a saturated second, opposite resistance state.

9. A method of operating a magnetic tunnel junction (MTJ) sensor that is configured with first and second active MTJ elements and first and second passive MTJ elements connected in a Wheatstone bridge configuration, the method comprising:
resetting a magnetic history of the sensor by applying a reset current pulse with a first polarity to the sensor sufficient to magnetically saturate all of the MTJ elements;
monotonically changing an output signal of the sensor toward a chosen endpoint by applying monotonically increasing current with a second polarity opposite the first polarity to a coil of the sensor;
monitoring whether the output signal of the sensor has reached the chosen endpoint; and
recording a value of the current applied to the coil at a time when the output signal of the sensor reaches the chosen endpoint, and converting the recorded current value to a corresponding external magnetic field value.

10. The method of claim 9, wherein resetting the magnetic history of the sensor comprises applying a reset current pulse through the coil that is sufficient to magnetically saturate the first and second active MTJ elements and the first and second passive MTJ elements.

11. The method of claim 10, wherein the reset current pulse drives the first and second active MTJ elements to a saturated first resistance state and drives the first and second passive MTJ elements to a saturated second, opposite resistance state.

12. The method of claim 9, wherein the chosen endpoint is a zero volts output voltage of the sensor.

13. The method of claim 9, wherein applying monotonically increasing current to a coil of the sensor is performed without current reversal in the coil.

14. The method of claim 9, wherein monotonically changing an output signal of the sensor toward a chosen endpoint by applying monotonically increasing current to a coil of the sensor and monitoring whether the output signal of the sensor has reached the chosen endpoint comprises employing proportional-integral-derivative (PID) control to prevent overshoot in determining when the output signal of the sensor has reached the chosen endpoint.

15. The method of claim 9, wherein converting the recorded current value to a corresponding external magnetic field value is based on previous calibration of the MTJ sensor.

* * * * *